US011255120B2

(12) United States Patent
Shrivastava et al.

(10) Patent No.: US 11,255,120 B2
(45) Date of Patent: Feb. 22, 2022

(54) TESTER AND ELECTRICAL CONNECTORS FOR INSULATED GLASS UNITS

(71) Applicant: View, Inc., Milpitas, CA (US)

(72) Inventors: Dhairya Shrivastava, Los Altos, CA (US); Stephen Clark Brown, San Mateo, CA (US); Kevin Kazuo Kaneshiro, San Jose, CA (US); Gordon E. Jack, San Jose, CA (US)

(73) Assignee: View, Inc., Milpitas, CA (US)

( * ) Notice: Subject to any disclaimer, the term of this patent is extended or adjusted under 35 U.S.C. 154(b) by 55 days.

(21) Appl. No.: 16/469,848

(22) PCT Filed: Dec. 14, 2017

(86) PCT No.: PCT/US2017/066486
§ 371 (c)(1),
(2) Date: Jun. 14, 2019

(87) PCT Pub. No.: WO2018/112241
PCT Pub. Date: Jun. 21, 2018

(65) Prior Publication Data
US 2020/0080364 A1 Mar. 12, 2020

Related U.S. Application Data

(63) Continuation-in-part of application No. 14/401,081, filed as application No. PCT/US2013/042765 on May 24, 2013, now abandoned.
(Continued)

(51) Int. Cl.
*E06B 3/67* (2006.01)
*E06B 9/24* (2006.01)
(Continued)

(52) U.S. Cl.
CPC .............. *E06B 3/6722* (2013.01); *E06B 9/24* (2013.01); *G01R 19/08* (2013.01); *G06F 3/0482* (2013.01);
(Continued)

(58) Field of Classification Search
CPC .. E06B 3/6722; E06B 9/24; E06B 2009/2464; H04Q 9/00; H04Q 2209/40;
(Continued)

(56) References Cited

U.S. PATENT DOCUMENTS 253,392 A 2/1882 Jones et al.
2,121,753 A 6/1938 Cornell, Jr.
(Continued)

FOREIGN PATENT DOCUMENTS

CN 1380991 A 11/2002
CN 1808505 A 7/2006
(Continued)

OTHER PUBLICATIONS

U.S. Appl. No. 62/102,515, filed Jan. 12, 2015, Nagar et al.
(Continued)

*Primary Examiner* — Paresh Patel
(74) *Attorney, Agent, or Firm* — Weaver Austin Villeneuve & Sampson LLP; Brian D. Griedel

(57) ABSTRACT

In some implementations, an apparatus for testing an insulated glass unit is provided. The apparatus includes a housing and a port coupled to the housing, where the port is configured to couple with a pigtail of an insulated glass unit. The apparatus includes a battery housed within the housing, where the battery is configured to provide power to an insulated glass unit. The apparatus includes an input interface which is coupled to the housing, where the input interface is configured to receive. The apparatus includes a controller which is housed within the housing and is con-
(Continued)

figured to receive the input from the input interface, send commands to an insulated glass unit, and receive data from the insulated glass unit. The apparatus also includes one or more indicators coupled with the housing, where the one or more indicators are configured to indicate a status of the insulated glass unit.

20 Claims, 17 Drawing Sheets

Related U.S. Application Data

(60) Provisional application No. 62/434,216, filed on Dec. 14, 2016, provisional application No. 61/652,021, filed on May 25, 2012.

(51) Int. Cl.
    *G01R 19/08*     (2006.01)
    *H04Q 9/00*     (2006.01)
    *G06F 3/0482*     (2013.01)
    *H04L 29/08*     (2006.01)
    *G06F 3/0488*     (2013.01)
    *H04L 67/125*     (2022.01)

(52) U.S. Cl.
    CPC ............ *H04L 67/125* (2013.01); *H04Q 9/00* (2013.01); *E06B 2009/2464* (2013.01); *G06F 3/0488* (2013.01); *H04Q 2209/40* (2013.01)

(58) Field of Classification Search
    CPC ..... G01R 19/08; H04L 67/125; G06F 3/0482; G06F 3/0488
    See application file for complete search history.

(56) References Cited

U.S. PATENT DOCUMENTS

| | | | |
|---|---|---|---|
| 3,379,859 A | 4/1968 | Hunter et al. | |
| 3,876,862 A | 4/1975 | Newman et al. | |
| 4,129,861 A | 12/1978 | Giglia | |
| 4,306,140 A | 12/1981 | Stromquist | |
| 4,553,085 A | 11/1985 | Canzano | |
| 4,691,486 A | 9/1987 | Niekrasz et al. | |
| 4,937,423 A | 6/1990 | Yoshihara et al. | |
| 4,941,302 A | 7/1990 | Barry | |
| 4,958,917 A | 9/1990 | Hashimoto et al. | |
| 5,017,755 A | 5/1991 | Yahagi et al. | |
| 5,097,358 A | 3/1992 | Ito et al. | |
| 5,124,833 A | 6/1992 | Barton et al. | |
| 5,170,108 A | 12/1992 | Peterson et al. | |
| 5,313,761 A | 5/1994 | Leopold | |
| 5,379,146 A | 1/1995 | Defendini | |
| 5,384,653 A | 1/1995 | Benson et al. | |
| 5,416,617 A | 5/1995 | Loiseaux et al. | |
| 5,477,152 A | 12/1995 | Hayhurst | |
| 5,579,149 A | 11/1996 | Moret et al. | |
| 5,657,149 A | 8/1997 | Buffat et al. | |
| 5,657,150 A | 8/1997 | Kallman et al. | |
| 5,724,175 A | 3/1998 | Hichwa et al. | |
| 5,822,107 A | 10/1998 | Lefrou et al. | |
| 5,877,936 A | 3/1999 | Nishitani et al. | |
| 5,948,195 A | 9/1999 | Thomas | |
| 6,001,487 A | 12/1999 | Ladang et al. | |
| 6,039,390 A | 3/2000 | Agrawal et al. | |
| 6,045,896 A | 4/2000 | Boire et al. | |
| 6,055,088 A | 4/2000 | Fix et al. | |
| 6,055,089 A | 4/2000 | Schulz et al. | |
| 6,068,720 A | 5/2000 | McHugh | |
| 6,176,715 B1 | 1/2001 | Buescher | |
| 6,204,953 B1 | 3/2001 | Zieba et al. | |
| 6,261,641 B1 | 7/2001 | Zieba et al. | |
| 6,262,831 B1 | 7/2001 | Bauer et al. | |
| 6,337,758 B1 | 1/2002 | Beteille et al. | |
| 6,344,748 B1 | 2/2002 | Gannon | |
| 6,369,935 B1 | 4/2002 | Cardinal et al. | |
| 6,407,847 B1 | 6/2002 | Poll et al. | |
| 6,420,071 B1 | 7/2002 | Lee et al. | |
| 6,529,308 B2 | 3/2003 | Beteille et al. | |
| 6,559,411 B2 | 5/2003 | Borgeson et al. | |
| 6,567,708 B1 | 5/2003 | Bechtel et al. | |
| 6,707,590 B1 | 3/2004 | Bartsch | |
| 6,795,226 B2 | 9/2004 | Agrawal et al. | |
| 6,897,936 B1 | 5/2005 | Li et al. | |
| 6,919,530 B2 | 7/2005 | Borgeson et al. | |
| 6,950,221 B1 | 9/2005 | Terada et al. | |
| 6,965,813 B2 | 11/2005 | Granqvist et al. | |
| 7,002,720 B2 | 2/2006 | Beteille et al. | |
| 7,033,655 B2 | 4/2006 | Beteille et al. | |
| 7,133,181 B2 | 11/2006 | Greer | |
| 7,230,748 B2 | 6/2007 | Giron et al. | |
| 7,259,730 B2 | 8/2007 | O'Keeffe | |
| 7,362,491 B2 | 4/2008 | Busick et al. | |
| 7,531,101 B2 | 5/2009 | Beteille | |
| 7,586,664 B2 | 9/2009 | O'Shaughnessy et al. | |
| 7,610,910 B2 | 11/2009 | Ahmed | |
| 7,684,105 B2 | 3/2010 | Lamontagne et al. | |
| 7,710,671 B1 | 5/2010 | Kwak et al. | |
| 7,800,812 B2 | 9/2010 | Moskowitz | |
| 7,869,114 B2 | 1/2011 | Valentin et al. | |
| 7,894,119 B2 | 2/2011 | Valentin et al. | |
| 7,929,194 B2 | 4/2011 | Legois et al. | |
| 7,941,245 B1 | 5/2011 | Popat | |
| 7,941,982 B2 | 5/2011 | Merica | |
| 7,966,078 B2 | 6/2011 | Hoffberg et al. | |
| 8,024,073 B2 | 9/2011 | Imes et al. | |
| 8,035,882 B2 | 10/2011 | Fanton et al. | |
| 8,149,756 B2 | 4/2012 | Hottinen | |
| 8,213,074 B1 | 7/2012 | Shrivastava et al. | |
| 8,214,494 B1 | 7/2012 | Slavin | |
| 8,254,013 B2 | 8/2012 | Mehtani et al. | |
| 8,509,400 B2 | 8/2013 | Liu et al. | |
| 8,643,933 B2 | 2/2014 | Brown et al. | |
| 8,669,503 B2 | 3/2014 | Johnson et al. | |
| 8,705,162 B2 | 4/2014 | Brown et al. | |
| 8,711,465 B2 | 4/2014 | Bhatnagar et al. | |
| 8,764,950 B2 | 7/2014 | Wang et al. | |
| 8,800,221 B1 | 8/2014 | Header | |
| 8,810,889 B2 | 8/2014 | Brown et al. | |
| 8,843,238 B2 | 9/2014 | Wenzel et al. | |
| 8,976,440 B2 | 3/2015 | Berland et al. | |
| 9,019,588 B2 | 4/2015 | Brown et al. | |
| 9,081,246 B2 | 7/2015 | Rozbicki | |
| 9,128,346 B2 | 9/2015 | Shrivastava et al. | |
| 9,170,008 B2 | 10/2015 | Reul et al. | |
| 9,300,581 B1 | 3/2016 | Hui et al. | |
| 9,436,054 B2 | 9/2016 | Brown et al. | |
| 9,442,338 B2 | 9/2016 | Uhm et al. | |
| 9,442,341 B2 | 9/2016 | Shrivastava et al. | |
| 9,470,947 B2 | 10/2016 | Nagel et al. | |
| 9,482,922 B2 | 11/2016 | Brown et al. | |
| 9,546,515 B2 | 1/2017 | Hall et al. | |
| 9,671,665 B2 | 6/2017 | Brown et al. | |
| 9,677,327 B1 | 6/2017 | Nagel et al. | |
| 9,690,162 B2 | 6/2017 | Brown et al. | |
| 9,690,174 B2 | 6/2017 | Wang | |
| 9,709,869 B2 | 7/2017 | Baumann et al. | |
| 9,728,920 B2 | 8/2017 | Brown et al. | |
| 9,740,074 B2 | 8/2017 | Agrawal et al. | |
| 9,769,459 B2 | 9/2017 | Thompson et al. | |
| 9,778,533 B2 | 10/2017 | Bertolini | |
| 9,946,138 B2 | 4/2018 | Shrivastava et al. | |
| 10,001,691 B2 | 6/2018 | Shrivastava et al. | |
| 10,137,764 B2 | 11/2018 | Driscoll et al. | |
| 10,139,696 B2 | 11/2018 | Brown et al. | |
| 10,139,697 B2 | 11/2018 | Wilbur et al. | |
| 10,175,549 B2 | 1/2019 | Brown et al. | |
| 10,180,606 B2 | 1/2019 | Mullins et al. | |
| 10,268,098 B2 | 4/2019 | Shrivastava et al. | |
| 10,288,971 B2 | 5/2019 | Phillips et al. | |
| 10,303,035 B2 | 5/2019 | Brown et al. | |
| 10,322,680 B2 | 6/2019 | Terashima et al. | |

(56) References Cited

U.S. PATENT DOCUMENTS

| | | |
|---|---|---|
| 10,365,531 B2 | 7/2019 | Shrivastava et al. |
| 10,387,221 B2 | 8/2019 | Shrivastava et al. |
| 10,409,652 B2 | 9/2019 | Shrivastava et al. |
| 10,481,459 B2 | 11/2019 | Shrivastava et al. |
| 10,514,963 B2 | 12/2019 | Shrivastava et al. |
| 10,591,799 B2 | 3/2020 | Brown et al. |
| 10,678,103 B2 | 6/2020 | Mullins et al. |
| 10,935,864 B2 | 3/2021 | Shrivastava et al. |
| 10,989,976 B2 | 4/2021 | Shrivastava et al. |
| 11,067,869 B2 | 7/2021 | Brown et al. |
| 11,092,868 B2 | 8/2021 | Phillips et al. |
| 11,137,659 B2 | 10/2021 | Shrivastava et al. |
| 2002/0027504 A1 | 3/2002 | Davis et al. |
| 2002/0075552 A1 | 6/2002 | Poll et al. |
| 2002/0113168 A1 | 8/2002 | Rukavina et al. |
| 2002/0149829 A1 | 10/2002 | Mochizuka et al. |
| 2002/0152298 A1 | 10/2002 | Kikta et al. |
| 2003/0111447 A1 | 6/2003 | Corkum et al. |
| 2003/0169574 A1 | 9/2003 | Maruyama et al. |
| 2003/0191546 A1 | 10/2003 | Bechtel et al. |
| 2003/0210450 A1* | 11/2003 | Yu ................. G02F 1/163 359/265 |
| 2003/0227663 A1 | 12/2003 | Agrawal et al. |
| 2004/0047050 A1 | 3/2004 | Bauer et al. |
| 2004/0208600 A1 | 10/2004 | Guenter et al. |
| 2004/0215520 A1 | 10/2004 | Butler et al. |
| 2005/0002081 A1 | 1/2005 | Beteille et al. |
| 2005/0063036 A1 | 3/2005 | Bechtel et al. |
| 2005/0166495 A1 | 8/2005 | Cho et al. |
| 2005/0200937 A1 | 9/2005 | Weidner |
| 2005/0270620 A1 | 12/2005 | Bauer et al. |
| 2005/0270621 A1 | 12/2005 | Bauer et al. |
| 2006/0001683 A1 | 1/2006 | May et al. |
| 2006/0018000 A1 | 1/2006 | Greer |
| 2006/0077511 A1 | 4/2006 | Poll et al. |
| 2006/0107616 A1 | 5/2006 | Ratti et al. |
| 2006/0187608 A1 | 8/2006 | Stark |
| 2006/0279527 A1 | 12/2006 | Zehner et al. |
| 2006/0283084 A1 | 12/2006 | Johnson |
| 2007/0020442 A1 | 1/2007 | Giron et al. |
| 2007/0053053 A1 | 3/2007 | Moskowitz |
| 2007/0067048 A1 | 3/2007 | Bechtel et al. |
| 2007/0097484 A1 | 5/2007 | Libretto et al. |
| 2007/0103761 A1 | 5/2007 | Giron et al. |
| 2007/0133078 A1 | 6/2007 | Fanton et al. |
| 2007/0236180 A1 | 10/2007 | Rodgers |
| 2007/0248756 A1 | 10/2007 | Krisko et al. |
| 2007/0285759 A1 | 12/2007 | Ash et al. |
| 2008/0018979 A1 | 1/2008 | Mahe et al. |
| 2008/0043316 A2 | 2/2008 | Moskowitz |
| 2008/0186562 A2 | 8/2008 | Moskowitz |
| 2008/0211682 A1 | 9/2008 | Hyland et al. |
| 2008/0238706 A1 | 10/2008 | Kenwright |
| 2008/0239452 A1 | 10/2008 | Xu et al. |
| 2008/0310007 A1 | 12/2008 | Agrawal et al. |
| 2009/0016715 A1 | 1/2009 | Furey |
| 2009/0058295 A1 | 3/2009 | Auday et al. |
| 2009/0067031 A1 | 3/2009 | Piroux et al. |
| 2009/0097098 A1 | 4/2009 | Piroux |
| 2009/0110918 A1 | 4/2009 | Jacquiod et al. |
| 2009/0114928 A1 | 5/2009 | Messere et al. |
| 2009/0130409 A1 | 5/2009 | Reutler et al. |
| 2009/0148642 A1 | 6/2009 | Mauser et al. |
| 2009/0153208 A1 | 6/2009 | Lynch |
| 2009/0157358 A1 | 6/2009 | Kim |
| 2009/0174300 A1 | 7/2009 | Jousse et al. |
| 2009/0181203 A1 | 7/2009 | Valentin et al. |
| 2009/0251758 A1 | 10/2009 | Valentin et al. |
| 2009/0257576 A1 | 10/2009 | Wellard et al. |
| 2009/0262411 A1 | 10/2009 | Karmhag et al. |
| 2009/0271042 A1 | 10/2009 | Voysey |
| 2009/0297806 A1 | 12/2009 | Dawson-Elli et al. |
| 2009/0323160 A1 | 12/2009 | Egerton et al. |
| 2009/0323162 A1 | 12/2009 | Fanton et al. |
| 2010/0039410 A1 | 2/2010 | Becker et al. |
| 2010/0066484 A1 | 3/2010 | Hanwright et al. |
| 2010/0067090 A1 | 3/2010 | Egerton et al. |
| 2010/0146883 A1 | 6/2010 | Benkel |
| 2010/0172009 A1 | 7/2010 | Matthews |
| 2010/0188057 A1 | 7/2010 | Tarng |
| 2010/0208326 A1 | 8/2010 | Kwak et al. |
| 2010/0228854 A1 | 9/2010 | Morrison et al. |
| 2010/0243427 A1 | 9/2010 | Kozlowski et al. |
| 2010/0245973 A1 | 9/2010 | Wang et al. |
| 2010/0274366 A1 | 10/2010 | Fata et al. |
| 2010/0315693 A1 | 12/2010 | Lam et al. |
| 2011/0043885 A1 | 2/2011 | Lamine et al. |
| 2011/0048614 A1 | 3/2011 | Veerasamy et al. |
| 2011/0051221 A1 | 3/2011 | Veerasamy |
| 2011/0059275 A1 | 3/2011 | Stark |
| 2011/0071685 A1 | 3/2011 | Huneycutt et al. |
| 2011/0094585 A1 | 4/2011 | Debije et al. |
| 2011/0097081 A1 | 4/2011 | Gupta et al. |
| 2011/0148218 A1 | 6/2011 | Rozbicki |
| 2011/0164317 A1 | 7/2011 | Verghol et al. |
| 2011/0184561 A1 | 7/2011 | Klasson et al. |
| 2011/0211247 A1 | 9/2011 | Kozlowski et al. |
| 2011/0216389 A1 | 9/2011 | Piroux et al. |
| 2011/0248014 A1 | 10/2011 | Chubb |
| 2011/0249314 A1 | 10/2011 | Wang et al. |
| 2011/0260961 A1 | 10/2011 | Burdis |
| 2011/0266137 A1 | 11/2011 | Wang et al. |
| 2011/0266138 A1 | 11/2011 | Wang et al. |
| 2011/0267672 A1 | 11/2011 | Sbar et al. |
| 2011/0267674 A1 | 11/2011 | Wang et al. |
| 2011/0267675 A1 | 11/2011 | Wang et al. |
| 2011/0279882 A1 | 11/2011 | Chan et al. |
| 2011/0292488 A1 | 12/2011 | McCarthy et al. |
| 2011/0299149 A1 | 12/2011 | Park et al. |
| 2012/0026573 A1 | 2/2012 | Collins et al. |
| 2012/0033287 A1 | 2/2012 | Friedman et al. |
| 2012/0062975 A1 | 3/2012 | Mehtani et al. |
| 2012/0086363 A1 | 4/2012 | Golding et al. |
| 2012/0140492 A1 | 6/2012 | Alvarez |
| 2012/0147449 A1 | 6/2012 | Bhatnagar et al. |
| 2012/0188627 A1 | 7/2012 | Chen et al. |
| 2012/0190386 A1 | 7/2012 | Anderson |
| 2012/0194895 A1 | 8/2012 | Podbelski et al. |
| 2012/0200908 A1 | 8/2012 | Bergh et al. |
| 2012/0232969 A1 | 9/2012 | Fadell et al. |
| 2012/0235493 A1 | 9/2012 | Kiuchi et al. |
| 2012/0239209 A1 | 9/2012 | Brown et al. |
| 2012/0259583 A1 | 10/2012 | Noboa et al. |
| 2012/0268803 A1 | 10/2012 | Greer et al. |
| 2012/0293855 A1 | 11/2012 | Shrivastava et al. |
| 2012/0300280 A1 | 11/2012 | Murphy et al. |
| 2012/0327499 A1 | 12/2012 | Parker et al. |
| 2013/0057937 A1 | 3/2013 | Berman et al. |
| 2013/0060357 A1 | 3/2013 | Li et al. |
| 2013/0085614 A1 | 4/2013 | Wenzel et al. |
| 2013/0085615 A1 | 4/2013 | Barker |
| 2013/0085616 A1 | 4/2013 | Wenzel et al. |
| 2013/0131869 A1 | 5/2013 | Majewski et al. |
| 2013/0157493 A1 | 6/2013 | Brown |
| 2013/0196600 A1 | 8/2013 | Capers et al. |
| 2013/0241299 A1 | 9/2013 | Snyker et al. |
| 2013/0271812 A1 | 10/2013 | Brown et al. |
| 2013/0271813 A1 | 10/2013 | Brown |
| 2013/0271814 A1 | 10/2013 | Brown |
| 2013/0271815 A1 | 10/2013 | Brown et al. |
| 2013/0278988 A1 | 10/2013 | Jack et al. |
| 2013/0278989 A1 | 10/2013 | Lam et al. |
| 2013/0319756 A1 | 12/2013 | Snyker et al. |
| 2014/0000191 A1 | 1/2014 | Snyker et al. |
| 2014/0041933 A1 | 2/2014 | Snyker et al. |
| 2014/0108647 A1 | 4/2014 | Bleess et al. |
| 2014/0156097 A1 | 6/2014 | Nesler et al. |
| 2014/0160550 A1 | 6/2014 | Brown et al. |
| 2014/0170863 A1 | 6/2014 | Brown |
| 2014/0192393 A1 | 7/2014 | Bhatnagar et al. |
| 2014/0236323 A1 | 8/2014 | Brown et al. |
| 2014/0247475 A1 | 9/2014 | Parker et al. |
| 2014/0303788 A1 | 10/2014 | Sanders et al. |
| 2014/0317514 A1 | 10/2014 | Bokotey |

(56) References Cited

U.S. PATENT DOCUMENTS

| | | |
|---|---|---|
| 2014/0330538 A1 | 11/2014 | Conklin et al. |
| 2014/0347190 A1 | 11/2014 | Grimm |
| 2014/0349497 A1 | 11/2014 | Brown et al. |
| 2014/0355097 A1 | 12/2014 | Brown et al. |
| 2014/0368899 A1 | 12/2014 | Greer |
| 2015/0002919 A1 | 1/2015 | Jack et al. |
| 2015/0023661 A1 | 1/2015 | Borkenhagen et al. |
| 2015/0070745 A1* | 3/2015 | Pradhan ............... G09G 3/19 359/275 |
| 2015/0092260 A1 | 4/2015 | Parker et al. |
| 2015/0103389 A1 | 4/2015 | Klawuhn et al. |
| 2015/0116811 A1 | 4/2015 | Shrivastava et al. |
| 2015/0118869 A1 | 4/2015 | Brown et al. |
| 2015/0120297 A1 | 4/2015 | Meruva |
| 2015/0003822 A1 | 6/2015 | Fukada et al. |
| 2015/0160525 A1 | 6/2015 | Shi |
| 2015/0219975 A1 | 8/2015 | Phillips et al. |
| 2015/0378230 A1 | 12/2015 | Gudmunson et al. |
| 2015/0378231 A1 | 12/2015 | Greer et al. |
| 2016/0052446 A1 | 2/2016 | Frey et al. |
| 2016/0054633 A1 | 2/2016 | Brown et al. |
| 2016/0070151 A1 | 3/2016 | Shrivastava et al. |
| 2016/0091769 A1 | 3/2016 | Rozbicki et al. |
| 2016/0109778 A1 | 4/2016 | Shrivastava et al. |
| 2016/0134932 A1 | 5/2016 | Karp et al. |
| 2016/0154290 A1 | 6/2016 | Brown et al. |
| 2016/0202589 A1 | 7/2016 | Nagel et al. |
| 2016/0299210 A1 | 10/2016 | Zeine |
| 2016/0344148 A1 | 11/2016 | Mullins et al. |
| 2016/0357083 A1 | 12/2016 | Brown et al. |
| 2016/0377948 A1 | 12/2016 | Rozbicki et al. |
| 2017/0045795 A1 | 2/2017 | Brown et al. |
| 2017/0006679 A1 | 3/2017 | Yeh et al. |
| 2017/0075183 A1 | 3/2017 | Brown |
| 2017/0075323 A1 | 3/2017 | Shrivastava et al. |
| 2017/0082903 A1 | 3/2017 | Vigano et al. |
| 2017/0097259 A1 | 4/2017 | Brown et al. |
| 2017/0097553 A1* | 4/2017 | Jack .................. G02F 1/0121 |
| 2017/0117674 A1 | 4/2017 | Brown et al. |
| 2017/0139301 A1 | 5/2017 | Messere et al. |
| 2017/0197494 A1 | 7/2017 | Li |
| 2017/0200424 A1 | 7/2017 | Xu et al. |
| 2017/0212400 A1 | 7/2017 | Shrivastava et al. |
| 2017/0219908 A1 | 8/2017 | Brown et al. |
| 2017/0234067 A1 | 8/2017 | Fasi et al. |
| 2017/0250163 A1 | 8/2017 | Wilbur et al. |
| 2017/0253801 A1 | 9/2017 | Bae et al. |
| 2017/0279930 A1 | 9/2017 | Zhang |
| 2017/0285432 A1 | 10/2017 | Shrivastava et al. |
| 2017/0285433 A1 | 10/2017 | Shrivastava et al. |
| 2017/0347129 A1 | 11/2017 | Levi et al. |
| 2017/0364395 A1 | 12/2017 | Shrivastava et al. |
| 2018/0088432 A1 | 3/2018 | Shrivastava et al. |
| 2018/0090992 A1 | 3/2018 | Shrivastava et al. |
| 2018/0129172 A1 | 5/2018 | Shrivastava et al. |
| 2018/0130455 A1 | 5/2018 | Plummer et al. |
| 2018/0144712 A1 | 5/2018 | Threlkel et al. |
| 2018/0189117 A1 | 7/2018 | Shrivastava et al. |
| 2018/0267380 A1 | 9/2018 | Shrivastava et al. |
| 2018/0284555 A1 | 10/2018 | Klawuhn et al. |
| 2018/0301858 A9 | 10/2018 | Mullins et al. |
| 2018/0314100 A1 | 11/2018 | Mullins et al. |
| 2019/0049811 A9 | 2/2019 | Shrivastava et al. |
| 2019/0056631 A1 | 2/2019 | Brown et al. |
| 2019/0121214 A1 | 4/2019 | Wilbur et al. |
| 2019/0155122 A1 | 5/2019 | Brown et al. |
| 2019/0196292 A1 | 6/2019 | Brown et al. |
| 2019/0235451 A1 | 8/2019 | Shrivastava et al. |
| 2019/0243207 A1 | 8/2019 | Brown et al. |
| 2019/0265571 A1 | 8/2019 | Phillips et al. |
| 2019/0271895 A1 | 9/2019 | Shrivastava et al. |
| 2019/0294018 A1 | 9/2019 | Shrivastava et al. |
| 2019/0331978 A1 | 10/2019 | Shrivastava et al. |
| 2019/0347141 A1 | 11/2019 | Shrivastava et al. |
| 2019/0353972 A1 | 11/2019 | Shrivastava et al. |
| 2019/0384652 A1 | 12/2019 | Shrivastava et al. |
| 2020/0301236 A1 | 9/2020 | Brown et al. |
| 2020/0310213 A1 | 10/2020 | Shrivastava et al. |
| 2020/0310214 A1 | 10/2020 | Brown et al. |
| 2020/0393719 A1 | 12/2020 | Mullins et al. |
| 2021/0116769 A1 | 4/2021 | Shrivastava et al. |
| 2021/0149266 A1 | 5/2021 | Brown et al. |
| 2021/0208467 A1 | 7/2021 | Shrivastava et al. |

FOREIGN PATENT DOCUMENTS

| | | |
|---|---|---|
| CN | 1822951 A | 8/2006 |
| CN | 101013211 A | 8/2007 |
| CN | 101023711 A | 8/2007 |
| CN | 101213788 A | 7/2008 |
| CN | 101365850 A | 2/2009 |
| CN | 102253559 A | 11/2011 |
| CN | 202108407 U | 1/2012 |
| CN | 103649826 | 3/2014 |
| CN | 103649826 A | 3/2014 |
| CN | 104335595 A | 2/2015 |
| CN | 105143586 A | 12/2015 |
| DE | 2113876 A1 | 10/1972 |
| DE | 3531443 A1 | 9/1985 |
| DE | 10322561 A1 | 12/2004 |
| DE | 102006042538 | 3/2008 |
| EP | 0920210 A1 | 6/1999 |
| EP | 1267029 A1 | 12/2002 |
| EP | 0676058 B1 | 4/2003 |
| EP | 1529922 A2 | 10/2004 |
| EP | 1929701 A2 | 11/2008 |
| EP | 2136409 | 12/2009 |
| EP | 2348357 | 7/2011 |
| EP | 2357544 | 8/2011 |
| EP | 2648086 A2 | 10/2013 |
| EP | 2764998 A1 | 8/2014 |
| EP | 3015915 A1 | 5/2016 |
| EP | 3293941 A1 | 3/2018 |
| EP | 3352053 A1 | 7/2018 |
| FR | 2938289 A1 | 5/2010 |
| GB | 1437198 | 5/1976 |
| JP | H10-215492 A | 8/1998 |
| JP | 2000-257352 A | 9/2000 |
| JP | 2001-193364 | 7/2001 |
| JP | 2003-284160 A | 10/2003 |
| JP | 2004-505298 A | 2/2004 |
| JP | 2004-504630 A | 12/2004 |
| JP | 2007-156909 A | 6/2007 |
| JP | 2007-516147 A | 6/2007 |
| JP | 2009-544997 A | 12/2009 |
| KR | 10-2012-0045915 | 5/2012 |
| KR | 10-2014-0004175 A | 1/2014 |
| KR | 10-1346862 B | 1/2014 |
| KR | 10-1799323 B1 | 11/2017 |
| RU | 2378672 C2 | 10/2010 |
| RU | 2009132962 A | 10/2010 |
| RU | 104808 U1 | 5/2011 |
| RU | 2012107324 A | 9/2013 |
| TW | 5263833 B | 4/2003 |
| TW | 200532346 A | 10/2005 |
| TW | 2011/15503 A | 5/2011 |
| TW | 201351010 A | 12/2013 |
| TW | 201606409 A | 2/2016 |
| TW | 2016/31551 A | 9/2016 |
| WO | WO98/42163 A1 | 9/1998 |
| WO | WO02/09338 A2 | 1/2002 |
| WO | WO2002/008826 A1 | 1/2002 |
| WO | WO02/13052 A2 | 2/2002 |
| WO | WO02/101188 A1 | 12/2002 |
| WO | WO2005/076061 | 8/2005 |
| WO | WO2006/133298 A2 | 12/2006 |
| WO | WO2007/029215 A2 | 3/2007 |
| WO | WO2006/133298 A3 | 12/2007 |
| WO | WO2008/043951 | 4/2008 |
| WO | WO2009/042359 A1 | 4/2009 |
| WO | WO2009/097001 A1 | 8/2009 |
| WO | WO2009/145876 | 12/2009 |
| WO | WO2009/148861 | 12/2009 |
| WO | WO2009/158510 A2 | 12/2009 |

(56) References Cited

FOREIGN PATENT DOCUMENTS

| WO | WO2010/077409 A2 | 7/2010 |
|---|---|---|
| WO | WO2010/120771 | 10/2010 |
| WO | WO2011/010067 | 1/2011 |
| WO | WO2011/028253 | 3/2011 |
| WO | WO2011/028254 | 3/2011 |
| WO | WO2011/050291 | 4/2011 |
| WO | WO2011/109688 | 9/2011 |
| WO | WO2012/079159 | 6/2012 |
| WO | WO2012/145155 | 10/2012 |
| WO | WO2013/090264 | 6/2013 |
| WO | WO2013/109881 | 7/2013 |
| WO | WO2013/155467 | 10/2013 |
| WO | WO2013/155467 A1 | 10/2013 |
| WO | WO2013/177575 A1 | 11/2013 |
| WO | WO2014/032023 | 2/2014 |
| WO | WO2014/082092 | 5/2014 |
| WO | WO2014/121809 | 8/2014 |
| WO | WO2014/130471 | 8/2014 |
| WO | WO2014/169253 | 10/2014 |
| WO | WO2015/051262 A1 | 4/2015 |
| WO | WO2015/120063 | 8/2015 |
| WO | WO2015/134789 | 9/2015 |
| WO | WO2015/168626 | 11/2015 |
| WO | WO2015/171886 A1 | 11/2015 |
| WO | WO2016/004109 | 1/2016 |
| WO | WO2016/085964 | 6/2016 |
| WO | WO2016/094445 | 6/2016 |
| WO | WO2016/183059 A1 | 11/2016 |
| WO | WO2017/007841 A1 | 1/2017 |
| WO | WO2017/059362 | 4/2017 |
| WO | WO2017/075059 | 5/2017 |
| WO | WO2017/155833 | 9/2017 |
| WO | WO2017/189618 | 11/2017 |
| WO | WO2017/189618 A1 | 11/2017 |
| WO | WO2017/192881 | 11/2017 |
| WO | WO2018/098089 | 5/2018 |
| WO | WO2018/200702 A1 | 11/2018 |
| WO | WO2018/200740 | 11/2018 |
| WO | WO2018/200740 A1 | 11/2018 |
| WO | WO2018/200752 | 11/2018 |
| WO | WO2018/200752 A1 | 11/2018 |
| WO | WO2019/040809 A1 | 2/2019 |
| WO | WO2019/141749 A1 | 7/2019 |
| WO | WO2019/203931 | 10/2019 |
| WO | WO2020/007638 A1 | 1/2020 |
| WO | WO2020/084083 A1 | 4/2020 |

OTHER PUBLICATIONS

U.S. Appl. No. 62/102,516, filed Jan. 12, 2015, Nagel et al.
U.S. Office Action dated Nov. 18, 2016 in U.S. Appl. No. 14/391,122.
U.S. Final Office Action dated Jul. 3, 2017 in U.S. Appl. No. 14/391,122.
U.S. Office Action dated Sep. 1, 2017 in U.S. Appl. No. 14/391,122.
U.S. Final Office Action dated Feb. 8, 2018 in U.S. Appl. No. 14/391,122.
U.S. Office Action dated Jun. 22, 2018 in U.S. Appl. No. 14/391,122.
U.S. Final Office Action dated Nov. 20, 2018 in U.S. Appl. No. 14/391,122.
U.S. Notice of Allowance dated Mar. 11, 2019 in U.S. Appl. No. 14/391,122.
U.S. Office Action dated Oct. 11, 2019 in U.S. Appl. No. 15/727,258.
U.S. Final Office Action dated Feb. 5, 2020 in U.S. Appl. No. 15/727,258.
European (extended) Search Report dated Dec. 4, 2015 in European Application No. 13775052.7.
International Search Report and Written Opinion dated Jul. 26, 2013, issued in PCT/US2013/036456.
International Preliminary Report on Patentability dated Oct. 23, 2014 issued in PCT/US2013/036456.
Russian Office Action dated Mar. 9, 2017 in RU Application No. 2014145565.
Chinese Office Action dated Jun. 21, 2017 in CN Application No. 201380025802.1.
Chinese Office Action dated Jan. 15, 2018 in CN Application No. 201380025802.1.
Indian Office Action dated Sep. 17, 2019 in Indian Application No. 2533/KOLNP/2014.
International Search Report and Written Opinion dated Jun. 5, 2017, issued in PCT/US17/20805.
International Preliminary Report on Patentability dated Sep. 20, 2018, issued in PCT/US17/20805.
European (extended) Search Report dated Nov. 28, 2019 in European Application No. 17763804.6.
European (Extended) Search Report dated Aug. 25, 2017 in European Application No. 17156033.7.
International Search Report and Written Opinion dated Apr. 13, 2018 for PCT/US2017/066486.
International Preliminary Report on Patentability dated Jun. 27, 2019 for PCT/US2017/066486.
U.S. Appl. No. 16/082,793, filed Sep. 6, 2018, Shrivastava et al.
U.S. Final Office Action dated Jan. 27, 2014 in U.S. Appl. No. 13/479,137.
U.S. Final Office Action dated Feb. 26, 2015 in U.S. Appl. No. 13/479,137.
U.S. Notice of Allowance dated May 14, 2015 in U.S. Appl. No. 13/479,137.
U.S. Notice of Allowance (supplemental) dated Jun. 12, 2015 in U.S. Appl. No. 13/479,137.
U.S. Office Action dated Sep. 23, 2013 in U.S. Appl. No. 13/479,137.
U.S. Office Action dated Jul. 3, 2014 in U.S. Appl. No. 13/479,137.
U.S. Final Office Action dated Sep. 19, 2016 in U.S. Appl. No. 14/887,178.
U.S. Final Office Action dated Mar. 17, 2017 in U.S. Appl. No. 14/887,178.
U.S. Notice of Allowance dated Mar. 9, 2018 in U.S. Appl. No. 14/887,178.
U.S. Office Action dated Mar. 25, 2016 in U.S. Appl. No. 14/887,178.
U.S. Office Action dated Oct. 23, 2017 in U.S. Appl. No. 14/887,178.
U.S. Notice of Allowance dated Dec. 13, 2018 in U.S. Appl. No. 15/978,029.
U.S. Office Action dated Jul. 24, 2018 in U.S. Appl. No. 15/978,029.
U.S. Office Action dated Aug. 22, 2019 in U.S. Appl. No. 16/298,776.
U.S. Office Action dated Aug. 21, 2019 in U.S. Appl. No. 16/508,099.
U.S. Final Office Action dated Mar. 15, 2018 in U.S. Appl. No. 14/951,410.
U.S. Notice of Allowance dated Oct. 22, 2018 in U.S. Appl. No. 14/951,410.
U.S. Office Action dated Sep. 11, 2017 in U.S. Appl. No. 14/951,410.
U.S. Office Action dated Jul. 25, 2019 in U.S. Appl. No. 16/253,971.
U.S. Notice of Allowance dated Nov. 28, 2018 in U.S. Appl. No. 15/123,069.
U.S. Notice of Allowance dated Jul. 17, 2019 in U.S. Appl. No. 15/123,069.
U.S. Office Action dated Apr. 27, 2018 in U.S. Appl. No. 15/123,069.
Preliminary Amendment dated Jan. 18, 2017 in U.S. Appl. No. 15/123,069.
U.S. Office Action dated Feb. 7, 2019 in U.S. Appl. No. 15/623,237.
U.S. Final Office Action dated Jul. 3, 2019 in U.S. Appl. No. 15/623,237.
U.S. Office Action dated Feb. 7, 2019 in U.S. Appl. No. 15/691,468.
U.S. Final Office Action dated Jul. 2, 2019 in U.S. Appl. No. 15/691,468.
U.S. Notice of Allowance dated Mar. 20, 2019 in U.S. Appl. No. 15/320,725.
U.S. Notice of Allowance (corrected) dated Apr. 18, 2019 in U.S. Appl. No. 15/320,725.
U.S. Office Action dated Sep. 4, 2018 in U.S. Appl. No. 15/320,725.
U.S. Notice of Allowance dated Jul. 17, 2019 in U.S. Appl. No. 15/320,725.
U.S. Final Office Action dated Jan. 31, 2019 in U.S. Appl. No. 15/534,175.
U.S. Notice of Allowance dated Apr. 17, 2019 in U.S. Appl. No. 15/534,175.

(56) References Cited

OTHER PUBLICATIONS

U.S. Notice of Allowance dated Jul. 25, 2019 in U.S. Appl. No. 15/534,175.
U.S. Office Action dated Jul. 6, 2018 in U.S. Appl. No. 15/534,175.
U.S. Office Action dated Feb. 4, 2019 in U.S. Appl. No. 15/623,235.
U.S. Notice of Allowance dated May 14, 2019 in U.S. Appl. No. 15/623,235.
U.S. Notice of Allowance dated Dec. 14, 2018 in U.S. Appl. No. 15/910,936.
U.S. Notice of Allowance dated Apr. 17, 2019 in U.S. Appl. No. 15/910,936.
U.S. Office Action dated Aug. 7, 2018 in U.S. Appl. No. 15/910,936.
Taiwanese Office Action dated Dec. 12, 2018 in TW Application No. 107129150.
CN Office Action dated Aug. 28, 2018 in CN Application No. 201580070776.3.
CN Office Action dated Mar. 19, 2019 in CN Application No. 201580070776.3.
CN Office Action dated Oct. 9, 2019 in CN Application No. 201580070776.3.
EP Extended Search Report dated Nov. 8, 2018 in EP Application No. 15863112.7.
EP Extended Search Report, dated Nov. 28, 2019 in EP Application No. 19188907.0.
International Preliminary Report on Patentability dated Jun. 8, 2017 in PCT/US2015/062480.
International Search Report and Written Opinion dated Feb. 15, 2016 in PCT/US2015/062480.
International Search Report and Written Opinion (ISA/KR) dated Jun. 14, 2019 in PCT/US2019/019455.
CN Office Action dated Feb. 2, 2019 in CN Application No. 201580015979.2.
CN Office Action dated Aug. 16, 2019 in CN Application No. 201580015979.2.
EP Extended Search Report dated Jun. 19, 2017 in EP Application No. 15758538.1.
EP Office Action dated Aug. 21, 2018 in EP Application No. 15758538.1.
RU Office Action dated Sep. 24, 2018 in RU Application No. 2016139012.
International Preliminary Report on Patentability dated Sep. 15, 2016 in Application No. PCT/US2015/019031.
International Search Report and Written Opinion dated May 29, 2015 in Application No. PCT/US2015/019031.
EP Extended Search Report dated Feb. 15, 2018 in EP Application No. 15814233.1.
EP Examination Report dated Mar. 4, 2019 in EP Application No. 15814233.1.
International Preliminary Report on Patentability dated Jan. 12, 2017 in PCT Application No. PCT/US15/38667.
International Search Report and Written Opinion dated Oct. 16, 2015 in PCT Application No. PCT/US15/38667.
EP Extended Search Report dated Jun. 5, 2018 in EP Application No. 15868003.3.
JP Office Action dated Nov. 19, 2019 in JP Application No. 2017-549175.
International Preliminary Report on Patentability dated Jun. 22, 2017 in PCT Application No. PCT/US15/64555.
International Search Report and Written Opinion dated Oct. 16, 2015 in PCT Application No. PCT/US15/64555.
Russian Office Action dated Jul. 10, 20019 in RU Application No. 2017123902.
International Preliminary Report on Patentability dated Apr. 18, 2019 in PCT/US17/54120.
International Search Report and Written Opinion (ISA/KR) dated Jan. 9, 2018 in PCT Application No. PCT/US17/54120.
International Search Report and Written Opinion dated Nov. 16, 2018 in PCT Application No. PCT/US2018/029460.
International Search Report and Written Opinion dated Oct. 15, 2018 in PCT Application No. PCT/US2018/029406.
International Preliminary Report on Patentability dated Nov. 7, 2019 in PCT Application No. PCT/US2018/029460.
International Search Report and Written Opinion dated Jul. 11, 2019 in PCT Application No. PCT/US2019/030467.
International Preliminary Report on Patentability dated Nov. 7, 2019 in PCT Application No. PCT/US2018/029406.
Taiwanese Office Action dated May 13, 2019 in TW Application No. 104139217.
APC by Schneider Electric, Smart-UPS 120V Product Brochure, 2013, 8 pp.
National Aeronautics & Space Administration, "Cloud Remote Sensing and Modeling," (undated) [http://atmospheres.gsfc.nasa.gov/climate/index.php?section=134].
Kipp & Zonen, "Solar Radiation" (undated) [http://www.kippzonen.com/Knowledge-Center/Theoretical-info/Solar-Radiation].
Duchon, Claude E. et al., "Estimating Cloud Type From Pyranometer Observations," Journal of Applied of Meteorology, vol. 38, Jan. 1999, pp. 132-141.
"SageGlass Unplugged™—wireless dynamic glass", 2014, 2 pages.
"Ossia Wireless Charging", screenshot and picture of Cota device, accessed Apr. 20, 2015, 1 page.
"SageGlass Mobile App" screenshot, accessed Aug. 28, 2015, 1 page.
"Sage Product Highlights" screenshot, accessed Aug. 28, 2015, 1 page.
"SageGlass Unplugged" screenshot, accessed Aug. 28, 2015, 1 page.
Preliminary Amendment filed Jun. 26, 2018 for U.S. Appl. No. 16/016,450.
U.S. Office Action dated Nov. 2014 in U.S. Appl. No. 13/456,056.
U.S. Office Action dated Oct. 6, 2014 in U.S. Appl. No. 13/968,258.
U.S. Final Office Action dated Jun. 5, 2015 in U.S. Appl. No. 13/968,258.
U.S. Office Action dated Jan. 21, 2016 in U.S. Appl. No. 13/968,258.
U.S. Notice of Allowance dated Jun. 20, 2016 in U.S. Appl. No. 13/968,258.
U.S. Office Action dated Aug. 8, 2019 in U.S. Appl. No. 16/386,096.
U.S. Office Action dated Jul. 11, 2013 in U.S. Appl. No. 13/312,057.
U.S. Notice of Allowance dated Dec. 13, 2013 in U.S. Appl. No. 13/312,057.
U.S. Office Action dated Jan. 30, 2015 in U.S. Appl. No. 14/152,873.
U.S. Notice of Allowance dated May 19, 2015 in U.S. Appl. No. 14/152,873.
U.S. Office Action dated Mar. 31, 2015 in U.S. Appl. No. 14/196,895.
U.S. Notice of Allowance dated Sep. 18, 2013 in U.S. Appl. No. 13/326,168.
U.S. Notice of Allowance dated Jun. 13, 2014 in U.S. Appl. No. 14/103,660, and allowed claims.
U.S. Notice of Allowance dated Oct. 9, 2014 in U.S. Appl. No. 14/325,290.
U.S. Notice of Allowance dated Feb. 25, 2015 in U.S. Appl. No. 14/325,290.
Office Action dated Feb. 4, 2015 for U.S. Appl. No. 14/591,851.
Final Office Action dated Sep. 11, 2015 for U.S. Appl. No. 14/591,851.
Notice of Allowance dated May 9, 2016 for U.S. Appl. No. 14/591,851.
Notice of Allowance (corrected) dated Jun. 30, 2016 for U.S. Appl. No. 14/591,851.
Notice of Allowance (2nd corrected) dated Aug. 9, 2016 for U.S. Appl. No. 14/591,851.
U.S. Notice of Allowance dated Feb. 15, 2017 for U.S. Appl. No. 15/217,873.
U.S. Notice of Allowance dated Mar. 28, 2018 for U.S. Appl. No. 15/597,041.
U.S. Notice of Allowance dated Jul. 19, 2018 for U.S. Appl. No. 15/597,041.
U.S. Notice of Allowance dated Mar. 14, 2019 for U.S. Appl. No. 16/163,445.
U.S. Notice of Allowance dated Jul. 31, 2019 for U.S. Appl. No. 16/163,445.
U.S. Notice of Allowance dated Dec. 12, 2019 for U.S. Appl. No. 16/163,445.
U.S. Office Action dated Jun. 27, 2016 for U.S. Appl. No. 14/363,769.

(56) References Cited

OTHER PUBLICATIONS

U.S. Notice of Allowance dated Nov. 18, 2016 for U.S. Appl. No. 14/363,769.
U.S. Notice of Allowability (Corrected) dated May 10, 2017 for U.S Appl. No. 14/363,769.
U.S. Notice of Allowance dated Mar. 17, 2017 for U.S. Appl. No. 15/394,637.
U.S. Notice of Allowance dated Oct. 5, 2017 for U.S. Appl. No. 15/493,003.
U.S. Notice of Allowance dated Jan. 31, 2018 for U.S. Appl. No. 15/493,003.
U.S. Notice of Allowance dated Jul. 23, 2018 for U.S. Appl. No. 15/493,003.
U.S. Notice of Allowance dated Oct. 11, 2017 for U.S. Appl. No. 15/228,992.
U.S. Notice of Allowance dated Jan. 25, 2018 for U.S. Appl. No. 15/228,992.
U.S. Notice of Allowance dated May 23, 2018 for U.S. Appl. No. 15/228,992.
U.S. Notice of Allowance dated Oct. 3, 2018 U.S. Appl. No. 15/228,992.
U.S. Notice of Allowance dated Nov. 14, 2019 for U.S. Appl. No. 16/016,450.
U.S. Notice of Allowance dated Dec. 5, 2017 for U.S. Appl. No. 15/243,816.
U.S. Notice of Allowance dated Apr. 1, 2018 for U.S. Appl. No. 15/243,816.
U.S. Notice of Allowance dated Aug. 23, 2018 for U.S. Appl. No. 15/243,816.
U.S. Office Action dated Jul. 15, 2016 for U.S. Appl. No. 14/401,081.
U.S. Final Office Action dated Jan. 10, 2017 for U.S. Appl. No. 14/401,081.
U.S. Office Action dated May 4, 2017 for U.S. Appl. No. 14/401,081.
U.S. Final Office Action dated Sep. 25, 2017 for U.S. Appl. No. 14/401,081.
U.S. Office Action dated Mar. 8, 2018 for U.S. Appl. No. 14/401,081.
U.S. Final Office Action dated Jul. 5, 2018 for U.S. Appl. No. 14/401,081.
U.S. Office Action dated Dec. 15, 2017 in U.S. Appl. No. 14/423,085.
U.S. Final Office Action dated Aug. 8, 2018 in U.S. Appl. No. 14/423,085.
U.S. Notice of Allowance dated Nov. 29, 2018 in U.S. Appl. No. 14/423,085.
U.S. Notice of Allowance (corrected) dated Apr. 19, 2019 in U.S. Appl. No. 14/423,085.
U.S. Office Action dated Nov. 29, 2019 in U.S. Appl. No. 16/407,080.
International Search Report and Written Opinion dated Aug. 12, 2013 for PCT/US2013/037644.
International Preliminary Report on Patentability dated Nov. 6, 2014 for PCT/US2013/037644.
International Search Report and Written Opinion dated Jul. 23, 2012, from PCT/US2011/063534.
International Preliminary Report on Patentability dated Jun. 20, 2013, from PCT/US2011/063534.
International Search Report and Written Opinion dated Apr. 1, 2013 from PCT/US2012/068950.
International Preliminary Report on Patentability dated Jun. 26, 2014 from PCT/US2012/068950.
International Search Report and Written Opinion dated May 18, 2015 for PCT/US2015/014479.
International Preliminary Report on Patentability dated Aug. 9, 2016 for PCT/US2015/014479.
International Search Report and Written Opinion for PCT/2013/042765 dated Aug. 23, 2013.
International Preliminary Report on Patentability for PCT/2013/042765 dated Dec. 4, 2014.
International Search Report and Written Opinion dated Nov. 22, 2013 for PCT/US2013/056506.
International Preliminary Report on Patentability dated Mar. 5, 2015 for PCT/US2013/056506.
Canadian Office Action dated May 1, 2019 in CA Application No. 2,882,878.
EP Office Action dated Nov. 4, 2013 for EP Application No. 11846667.1.
European Search Report dated Mar. 3, 2014 for EP Application No. 11846667.1.
European Search Report dated Apr. 2, 2015 for EP Application No. 12858168.3.
European Office Action dated Jul. 1, 2016 for EP Application No. 12858168.3.
European Office Action dated Mar. 13, 2017 for EP Application No. 12858168.3.
European Opposition dated Jun. 25, 2019 to EP Patent No. 2,791,451 (EP Application No. 12858168.3) by GEZE Gmbh.
Partial European Search Report dated Mar. 21, 2016 for EP Application No. 13830992.7.
Extended European Search Report dated Jul. 15, 2016 for EP Application No. 13830992.7.
Extended European Search Report dated Dec. 14, 2018 for EP Application No. 18194665.8.
European Office Action dated Dec. 8, 2017 in EP Application No. 13830992.7.
European Office Action dated Jul. 18, 2018 in EP Application No. 13830992.7.
European Office Action dated Mar. 19, 2019 in EP Application No. 13830992.7.
European Office Action dated Jul. 25, 2019 in EP Application No. 13830992.7.
CN Office Action dated Jun. 3, 2015 in CN Application No. 201280069715.1.
CN Office Action dated Mar. 11, 2016 in CN Application No. 201280069715.1.
CN Office Action dated Mar. 29, 2018 in CN Application No. 201610921855.7.
CN Office Action dated Dec. 18, 2018 in CN Application No. 201610921855.7.
CN Office Action dated Aug. 15, 2019 in CN Application No. 201610921855.7.
TW Office Action dated Oct. 28, 2016 in TW Application No. 101147237.
TW Office Action dated Aug. 23, 2018 in TW Application No. 106129194.
TW Office Action dated Jun. 25, 2019 in TW Application No. 106129194.
Armstrong, Dave, "Smart, energetic glass could take over" in *Earth Times*, [http://www.earthtimes.org/energy/smart-energetic-glass-take-over/2866/]. Apr. 12, 2015.
"'Smart glass' changes colour and produces electricity", *ZeeNewsIndia.com* [http://zeenews.india.com/news/sci-tech/smart-glass-changes-colour-and-produces-electricity_1577561.html] Apr. 12, 2015.
Boylestad, R., et al., "Electronic devices and circuit theory (7th Edition)," 1999, pp. 76-82.
McManis, C., "H-Bridges: theory and practice," Chuck's Robotics Notebook, 2004, 3 pp.
McWane, J., "Introduction to Electronics Technology (2nd Edition)," 1981, p. 12 & pp. 228-233.
Westinghouse User's Manual, "LD-325 Series," 2010, 67 pp.
"Velux" Skylights brochure, known as of Jan. 31, 2014, 4 pp.
U.S. Appl. No. 16/338,403, filed Mar. 29, 2019, Shrivastava et al.
U.S. Appl. No. 16/655,032, filed Oct. 16, 2019, Shrivastava et al.
U.S. Appl. No. 16/608,159, filed Oct. 24, 2019, Trikha et al.
U.S. Appl. No. 16/664,089, filed Oct. 25, 2019, Patterson et al.
U.S. Office Action dated Jun. 5, 2020 in U.S. Appl. No. 15/727,258.
U.S. Notice of Allowance dated Dec. 11, 2020 in U.S. Appl. No. 15/727,258.
U.S. Notice of Allowance dated Sep. 30, 2020 in U.S. Appl. No. 16/082,793.
U.S. Supplemental Notice of Allowance dated Feb. 5, 2021 in U.S. Appl. No. 16/082,793.
Chinese Office Action dated May 20, 2020 in CN Application No. 201810932986.4.
Chinese Office Action dated Nov. 23, 2020 in CN Application No. 201810932986.4.

(56) References Cited

OTHER PUBLICATIONS

Taiwanese Office Action dated Nov. 23, 2020 in TW Application No. 106107498.
Chinese Office Action dated May 26, 2020 in CN Application No. 201780079165.4.
Chinese Office Action dated Jan. 4, 2021 in CN Application No. 201780079165.4.
Chinese Office Action dated May 26, 2020 for 201780082949.2.
Chinese Office Action dated Jan. 13, 2021 for 201780082949.2.
European (Extended) Search Report dated Nov. 2, 2020 in European Application No. 17880595.8.
Preliminary Amendment filed Oct. 18, 2016 in U.S. Appl. No. 15/228,992.
Preliminary Amendment filed Jun. 22, 2017 for U.S. Appl. No. 15/493,003.
Preliminary Amendment filed Sep. 26, 2017 for U.S. Appl. No. 15/597,041.
U.S. Preliminary Amendment dated Jan. 23, 2020 in U.S. Appl. No. 16/469,848.
U.S. Office Action dated Mar. 17, 2021 for U.S. Appl. No. 16/168,720.
U.S. Notice of Allowance dated Feb. 21, 2020 for U.S. Appl. No. 16/016,450.
U.S. Office Action dated Dec. 23, 2020 for U.S. Appl. No. 16/197,178.
U.S. Office Action dated Apr. 16, 2020 in U.S. Appl. No. 16/407,080.
U.S. Final Office Action dated Nov. 25, 2020 in U.S. Appl. No. 16/407,080.
U.S. Final Office Action dated Mar. 31, 2021 in U.S. Appl. No. 16/407,080.
U.S. Final Office Action dated Mar. 6, 2020 in U.S. Appl. No. 16/386,096.
U.S. Office Action dated Sep. 10, 2020 in U.S. Appl. No. 16/386,096.
U.S. Final Office Action dated Jan. 6, 2021 in U.S. Appl. No. 16/386,096.
International Search Report and Written Opinion dated Aug. 19, 2014 for PCT/US2014/033870.
European Opposition Communication dated Jan. 31, 2020 enclosing Letter from Opponent to EP Patent No. 2,791,451 (EP Application No. 12858168.3) by GEZE Gmbh.
CN Office Action dated Mar. 27, 2020 in CN Application No. 201610921855.7.
CN Office Action dated Nov. 4, 2020 in CN Application No. 201610921855.7.
TW Decision of Rejection dated Jan. 30, 2020 in TW Application No. 106129194.
Ernst, Randi, "Gas Filling of IG Units" by FDR Design, Inc. (undated), 37 pages.
Halio Smart-Tinting Glass System, Product Data Sheet, Kinestral Technologies, 2017, 4 pp.
Halio Black Insulated Glass Unit, Product Data Sheet, Kinestral Technologies, 2020, 5 pp.
U.S. Appl. No. 63/109,306, filed Nov. 3, 2020, Marquez et al.
U.S. Appl. No. 17/247,823, filed Dec. 23, 2020, Shrivastava et al.
U.S. Appl. No. 17/211,697, filed Mar. 24, 2021, Shrivastava et al.
U.S. Appl. No. 16/883,975, filed May 26, 2020, Mullins et al.
U.S. Appl. No. 63/154,352, filed Feb. 26, 2021, Martinson et al.
U.S. Appl. No. 17/247,662, filed Dec. 18, 2021, Brown et al.
U.S. Notice of Allowance dated May 13, 2021 in U.S. Appl. No. 16/462,916.
Indian Office Action dated Sep. 17, 2021 in Indian Application No. 202038045168.
Chinese Office Action dated Jun. 3, 2021 in CN Application No. 201780079165.4.
Taiwanese Office Action dated Apr. 16, 2021 in TW Application No. 106140690.
U.S. Notice of Allowance dated Apr. 21, 2021 in U.S. Appl. No. 16/386,096.
U.S. Office Action dated Sep. 21, 2021 for U.S Appl. No. 16/777,758.
U.S. Notice of Allowance dated Sep. 17, 2021 for U.S. Appl. No. 16/168,720.
U.S. Notice of Allowance dated Oct. 13, 2021 for U.S. Appl. No. 16/883,975.
U.S. Notice of Allowance dated Jul. 14, 2021 for U.S. Appl. No. 16/197,178.
European Opposition Communication dated Jun. 2, 2021 from Opponent to EP U.S. Pat. No. 2,791,451 (EP Application No. 12858168.3) by GEZE Gmbh.
European Office Action dated Apr. 30, 2021 for EP Application No. 18194665.8.
TW Search Report received with TW Decision to Grant dated Apr. 27, 2021 in TW Application No. 106129194.
U.S. Appl. No. 63/214,741, filed Jun. 24, 2021, Marquez et al.
U.S. Appl. No. 17/400,596, filed Aug. 12, 2021, Shrivastava et al.
U.S. Appl. No. 63/170,245, filed Apr. 2, 2021, Martinson et al.
U.S. Appl. No. 63/212,483, filed Jun. 18, 2021, Martinson et al.
U.S. Appl. No. 17/365,900, filed Jul. 1, 2021, Phillips et al.

\* cited by examiner

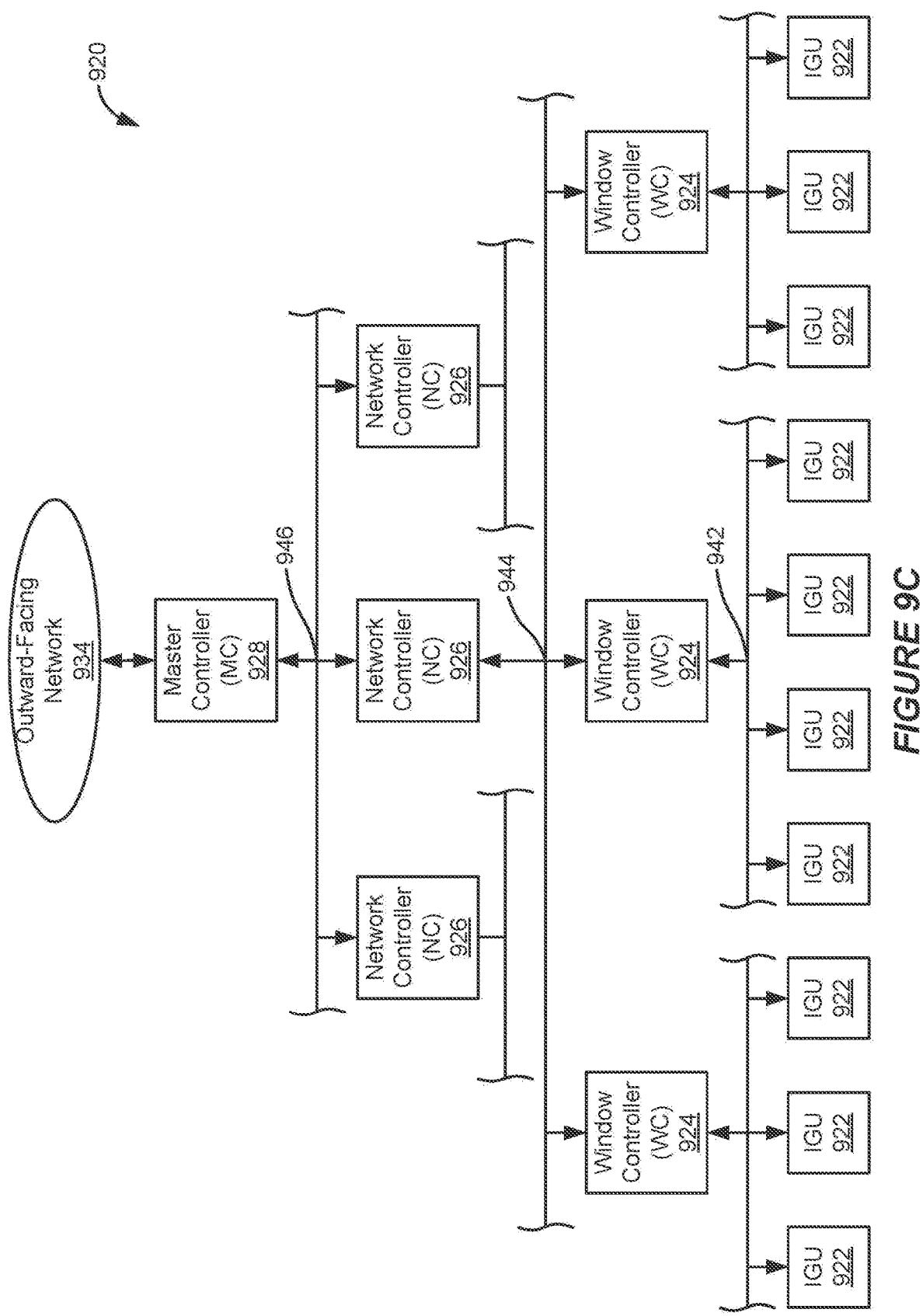

TESTER AND ELECTRICAL CONNECTORS FOR INSULATED GLASS UNITS

CROSS-REFERENCE TO RELATED APPLICATIONS

This application claims benefit of U.S. Provisional Patent Application No. 62/434,216, filed Dec. 14, 2016, and titled "TESTER AND ELECTRICAL CONNECTORS FOR INSULATED GLASS UNITS" (Attorney Docket No. VIEWP098P), which is incorporated herein by reference in its entirety and for all purposes. This application is also a Continuation-In-Part of United States Patent Application No. 14/401,081 (published as U.S. Patent Application Publication No. 2015/0103389), titled PORTABLE POWER SUPPLIES AND PORTABLE CONTROLLERS FOR SMART WINDOWS, filed on Nov. 13, 2014 (Attorney Docket No. VIEWP043), which is a National Phase application of PCT Application No. PCT/US13/42765, filed on May 24, 2013, which in turn claims benefit of U.S. Provisional Patent Application No. 61/652,021, filed May 25, 2012, each of which is hereby incorporated by reference in its entirety and for all purposes.

BACKGROUND

Electrochromism is a phenomenon in which a material exhibits a reversible electrochemically-mediated change in an optical property when placed in a different electronic state, typically by being subjected to a voltage change. The optical property is typically one or more of color, transmittance, absorbance, and reflectance.

Electrochromic ("EC") materials may be incorporated into, for example, windows for home, commercial and other uses as thin film coatings on the window glass. The color, transmittance, absorbance, and/or reflectance of such windows may be changed by inducing a change in the electrochromic material, for example, electrochromic windows are windows that can be darkened or lightened electronically. A small voltage applied to an electrochromic device of the window will cause them to darken; reversing the voltage polarity causes them to lighten. This capability allows control of the amount of light that passes through the windows, and presents an opportunity for electrochromic windows to be used as energy-saving devices.

While electrochromism was discovered in the 1960's, electrochromic devices, and particularly electrochromic windows, still, unfortunately, suffer various problems and have not begun to realize their full commercial potential despite many recent advancements in electrochromic technology, apparatus and related methods of making and/or using electrochromic devices.

SUMMARY

Some aspects of the present disclosure pertain to an apparatus having: (1) a housing; (2) a port coupled to the housing, the port configured to couple with a connector of a window having an electrochromic device, where the connector has contacts in electrical communication with the electrochromic device and an associated memory device; (3) a power source within the housing; (4) an input interface configured to receive an input; (5) a controller housed within the housing and electrically coupled to the power source and port, where the controller is configured to receive the input from the input interface, apply a voltage profile to the electrochromic device based on the received input, and receive data from the window; and (6) one or more indicators configured to indicate a status of the window.

In some embodiments, the voltage profile applied by the controller is applied for about 10 seconds or less, and the data received by the controller includes test data. In some embodiments, application of the voltage profile does not substantially tint the window.

In some embodiments, the apparatus includes a daughter card coupled to the controller, where the daughter card is configured to connect to an ultra-wideband module, a communications module (e.g., configured for Bluetooth or Wi-Fi communication), or circuitry for charging a rechargeable battery.

In some embodiments, the apparatus includes a communications module in communication with the controller, where the communications module is configured to send and receive wireless communications. The controller may, in some cases, be configured to send wireless communications to a remote site monitoring system via the communications module. In some cases, the apparatus has Bluetooth Low Energy (BLE) module or an ultra-wideband module configured to provide the controller with location information of the window coupled to the port of the apparatus. In some embodiments, the controller is configured to transmit location information of the window to the remote computing device(s) via the communications module for commissioning the window on a window network.

In some embodiments, the apparatus includes a securing interface coupled to the housing, which is configured to couple with a carabiner and/or lanyard. In some embodiments, indicators may be coupled to the housing.

In some embodiments, the input interface is a button coupled with the housing. In some embodiments, the power source is a rechargeable battery.

In some embodiments, the apparatus has a measurement module electrically coupled to the controller for measuring a current response of the electrochromic device in response to an applied voltage profile.

In some embodiments, the controller is configured to calculate a current density of the electrochromic device based on an applied voltage profile, a current response in response to the applied voltage profile, and the dimensions of the electrochromic device.

Another aspect of the present disclosure pertains to an apparatus having a connection interface configured to couple with a connector of a window including an electrochromic device, the connection interface including (1) a plurality of contacts configured to allow charge to drain from the electrochromic device and (2) a keying interface configured to mechanically couple the connection interface with the window connector.

In some embodiments, the apparatus has 2 pins that are shorted together, and in some embodiments, the connection interface is a 5-pin connection interface. In some embodiments, at least one of the contacts is a spring contact.

In some embodiments, the apparatus includes an attachment component to protect the connector. An attachment component may be, e.g., a clip configured to be fastened to the window, or the attachment component may be configured to be placed within a secondary seal of an insulated glass unit.

Another aspect of the present disclosure pertains to a method for determining a status of a window having an electrochromic device and a connector in electrical communication with the electrochromic device. The method includes the following operations. In a first operation a tester is connected to the connector via a port on the tester, where the tester includes a power source, a controller configured to apply a voltage profile to the electrochromic device, a measurement module electrically coupled to the controller for measuring a voltage response of the electrochromic device in response to an applied current profile, and one or more indicators. In a second operation, a current density of the electrochromic device is calculated, where the current density is calculated based on the dimensions of the electrochromic device and a voltage response to an applied current profile. Finally, in a third operation, a status of the window is indicated via the indicator(s), where the status is based on the current density.

In some cases, the indicator(s) may be coupled to a housing of the tester. In some cases, the dimensions of the electrochromic device are received from memory associated with the connector.

In some cases, the method further includes saving the measured voltage response to a memory device associated with the connector or a mobile device that in communication with the tester. The mobile device then may, in some cases, upload the measured voltage response to cloud-based storage.

In some cases, the voltage profile causes a voltage to be applied to the window for about 10 seconds or less, and in some cases, application of the voltage profile does not substantially tint the window.

In some cases, the method includes sending window information that includes the window status to a site monitoring system via a communications module of the controller. In some cases, the method further includes determining that a window was installed at an incorrect site or location within a building.

In some cases, the method further includes disconnecting the tester from the connector, and, in some cases, connecting a window controller to the connector, where the window controller is not the tester.

Another aspect of the present disclosure pertains to a system for commissioning a network of electrochromic windows in a building. The system includes items (1)-(3). Item (1) is a tester configured to determine a status of an electrochromic window. The tester includes a port configured to be attached to an electrochromic window connector, circuitry configured to apply a voltage profile to the electrochromic window and monitor a current response, where the status of the electrochromic window is based on the monitored current response, an ultra-wideband module, and a communications module. Item (2) includes a plurality of anchors having an ultra-wideband module and a communications module. Item (3) is a computer program product configured to determine the position of the electrochromic window based on ultra-wideband signals transmitted between the tester and the anchors, where the computer program product further has instructions to commission the electrochromic window or report the status of the electrochromic window to a site monitoring system.

In some embodiments, the computer program product operates on a master control or a network controller, and in some embodiments, it operates on a mobile device, on a remote server, or on the cloud.

Another aspect of the present disclosure pertains to a method for preparing an optically switchable window for installation, where the optically switchable window has a window connector having at least two electrical contacts for delivering charge to an electrochromic device. The method includes steps of (A) electrically coupling the at least two electrical contacts so that electric charge is drained from the electrochromic device, and (B) electrically decoupling the at least two electrical contacts once the charge has been substantially dissipated from the electrochromic device.

In some cases, electrically coupling the at least two electrical contacts includes attaching a cap to the window connector. The cap may, in some cases, have electrically coupled contacts configured to mate with the contacts of the window connector when the cap is attached to the window connector.

In some cases, electrically coupling the at least two electrical contacts includes placing a resistor in series with the at least two electrical contacts to control the rate of which charge is drained from the electrochromic device.

In some cases, electrically coupling the at least two electrical contacts includes placing circuitry in series with the at least two electrical contacts where the circuitry is configured to indicate when charge has been substantially drained from the electrochromic device.

In some cases, the at least two electrical contacts are electrically decoupled after the optically switchable window is transported to an installation site.

In some cases, the method further includes use of a tester having a power source, a controller configured to apply a voltage profile to the electrochromic device via the two or more electrical contacts, a measurement module electrically coupled to the controller for measuring a voltage response of the electrochromic device in response to an applied current profile, and one or more indicators. When using the tester, the method may also have include operations (C)-(E). In operation (C), the tester is connected to the window connector via a port on the tester after electrically decoupling the at least two electrical contacts. In operation (D), a current density of the electrochromic device is calculated based on the dimensions of the electrochromic device and a voltage response to an applied current profile. In operation (E), a status of the optically switchable window is indicated via the one or more indicators on the tester, where the status is based on the calculated current density.

In some cases, electrically coupling the electrical contacts of the window connector includes placing a conductor in series with the at least two electrical contacts to control the rate of which charge is drained from the electrochromic device. In some cases, electrical coupling of the contacts of a window connector is maintained until the switchable window is delivered to an installation site.

These and other features of the disclosed embodiments will be described more fully with reference to the associated drawings.

BRIEF DESCRIPTION OF THE DRAWINGS

FIG. 9C shows a block diagram of an example network system, operable to control a plurality of insulated glass units.

DETAILED DESCRIPTION

Introduction

Figure 1:
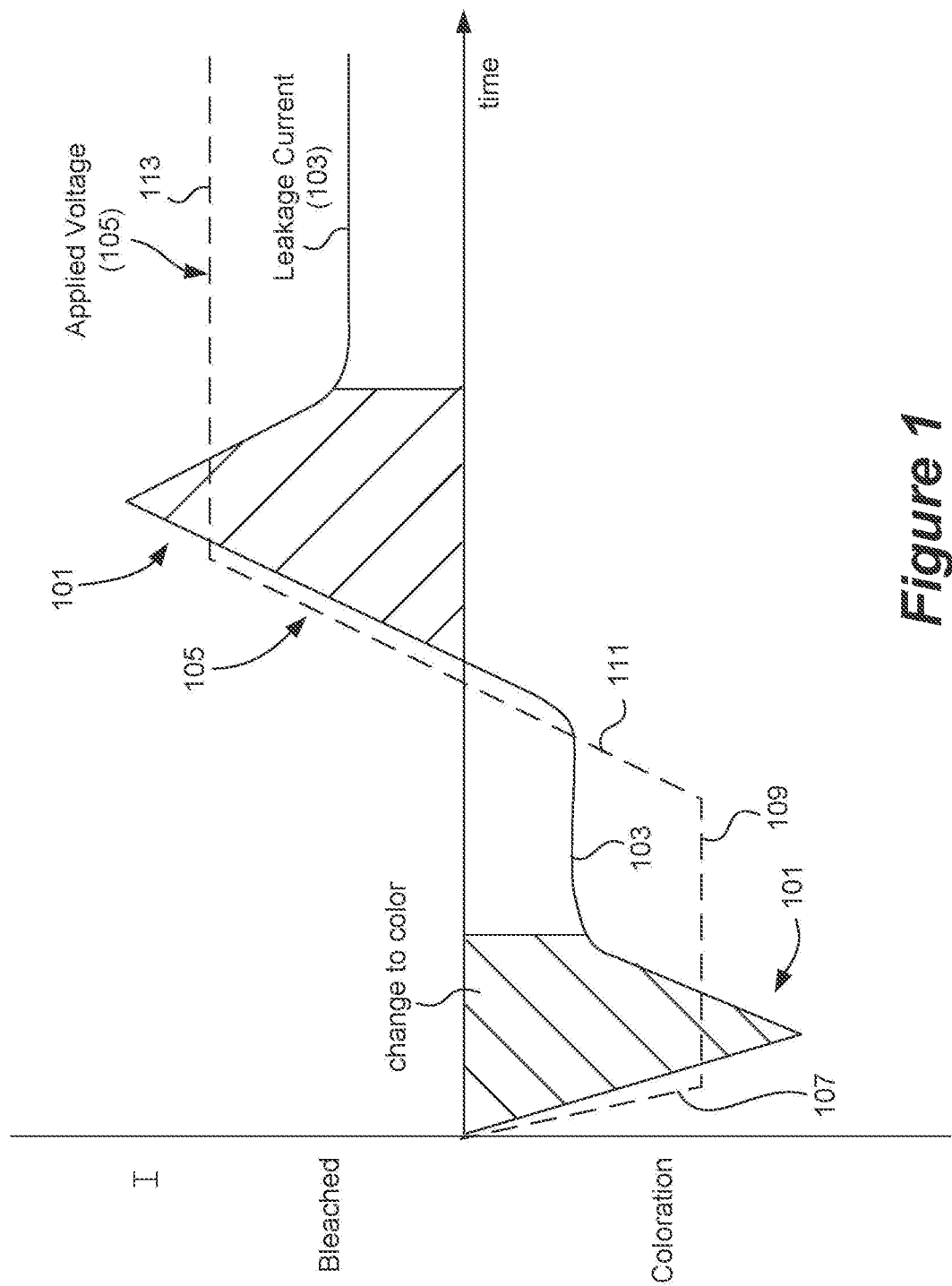
FIG. 1 is a graph illustrating voltage and current profiles associated with driving an electrochromic device from a clear state to a tinted state and from a tinted state to a clear state.

The following detailed description is directed to certain embodiments or implementations for the purposes of describing the disclosed aspects. However, the teachings herein can be applied and implemented in a multitude of different ways. In the following detailed description, references are made to the accompanying drawings. Although the disclosed implementations are described in sufficient detail to enable one skilled in the art to practice the implementations, it is to be understood that these examples are not limiting; other implementations may be used and changes may be made to the disclosed implementations without departing from their spirit and scope. Furthermore, while the disclosed embodiments focus on electrochromic windows (also referred to as optical switchable windows and smart windows), the concepts disclosed herein may apply to other types of switchable optical devices including, for example, liquid crystal devices and suspended particle devices, among others. For example, a liquid crystal device or a suspended particle device, rather than an electrochromic device, could be incorporated into some or all of the disclosed implementations. Additionally, the conjunction "or" is intended herein in the inclusive sense where appropriate unless otherwise indicated; for example, the phrase "A, B or C" is intended to include the possibilities of "A," "B," "C," "A and B," "B and C," "A and C" and "A, B and C." Further, as used herein, the terms pane, lite, and substrate are used interchangeably to refer to the surfaces, e.g., glass, where an electrochromic device is placed on or the surfaces of an insulated glass unit ("IGU"). An electrochromic window may be in the form of a laminate structure, an IGU, or both, i.e., where an IGU includes two substantially transparent substrates, or two panes of glass, where at least one of the substrates includes an electrochromic device disposed thereon, and the substrates have a spacer, or separator, disposed between them. One or more of these substrates may itself be a structure having multiple substrates, e.g., two or more sheets of glass.

An IGU is typically hermetically sealed, having an interior region that is isolated from the ambient environment. A window assembly may include an IGU, electrical connectors for coupling the one or more electrochromic devices of the IGU to a window controller, and a frame that supports the IGU and related wiring, including an IGU connector, e.g., a pigtail.

A challenge presented by electrochromic window technology is ensuring that an IGU arrives at an installation site, or building, in a clear, or bleached, state without any tinting, or coloration. This is true for a number of reasons, including that when IGUs are tinted or colored, customers may think they have the wrong product, and also it is very useful to the installer or the one commissioning the glass to have all the IGUs in the same state upon startup or when hooking up the window controllers. IGUs are typically shipped by a manufacturer to a site where they are to be installed. Oftentimes the manufacturer will have recently tested the IGUs, e.g., during quality control checks by putting the glass into a tinted state. When IGUs arrive at their installation site in varying tint states due to leakage current in the IGU, a building manager or other installation technician, e.g., glaziers, construction workers, electricians, etc., unfamiliar with the operation of electrochromic windows may express concern as to why the different IGUs are tinted differently and may even believe that the IGUs are malfunctioning or broken or that the incorrect product was shipped to the site. A related challenge is ensuring that electrochromic windows arrive at their installation site without damage to their components, such as, for example, damage caused to pigtail wiring by debris or damage to the lites is caused by a loose pigtail. To facilitate in addressing these challenges, in some implementations, a pigtail cap may be utilized to drain current from an IGU while also protecting the pigtail from debris while the IGU is in transit to an installation site.

Another challenge presented by electrochromic window technology is ensuring that separation and verifiability of trades exists during electrochromic window installation and that malfunctioning IGUs may be replaced as early into the site installation process as possible. A glazier, or other professional responsible for installing an IGU at a site, is typically one of the first at an installation deployment to work with the IGUs and set up the physical electrochromic window network. Oftentimes, there is a passage of time, days or weeks, before the next tradesman, e.g., a low voltage electrician ("LVE") arrives at the jobsite to install the window controllers and associated wiring. Without being able to verify that their IGU installation work has been correctly completed at the time they do it, glaziers may be called back to an installation site after their job has been completed to troubleshoot a problem arising subsequent to their installation work, or, worse yet, may be blamed or penalized for damage to the electrochromic window network arising subsequent to their installation work. Assessing where problems are located in an installed electrochromic window network is difficult without having information such as what windows were functioning properly before and after installation. To facilitate in addressing these challenges, in some implementations, a portable tester may be used to verify that an IGU is properly functioning after being installed. This allows the IGU to be tested without the window controller and associated wiring being installed at the jobsite. Such testers are also useful in the factory that makes the IGUs, e.g., for testing the IGUs on the assembly line or in stock, to make sure they are functioning properly prior to shipment or even testing them during shipment to ensure the integrity of the shipment, e.g., if damage is suspected.

Control Algorithms

Figure 2:
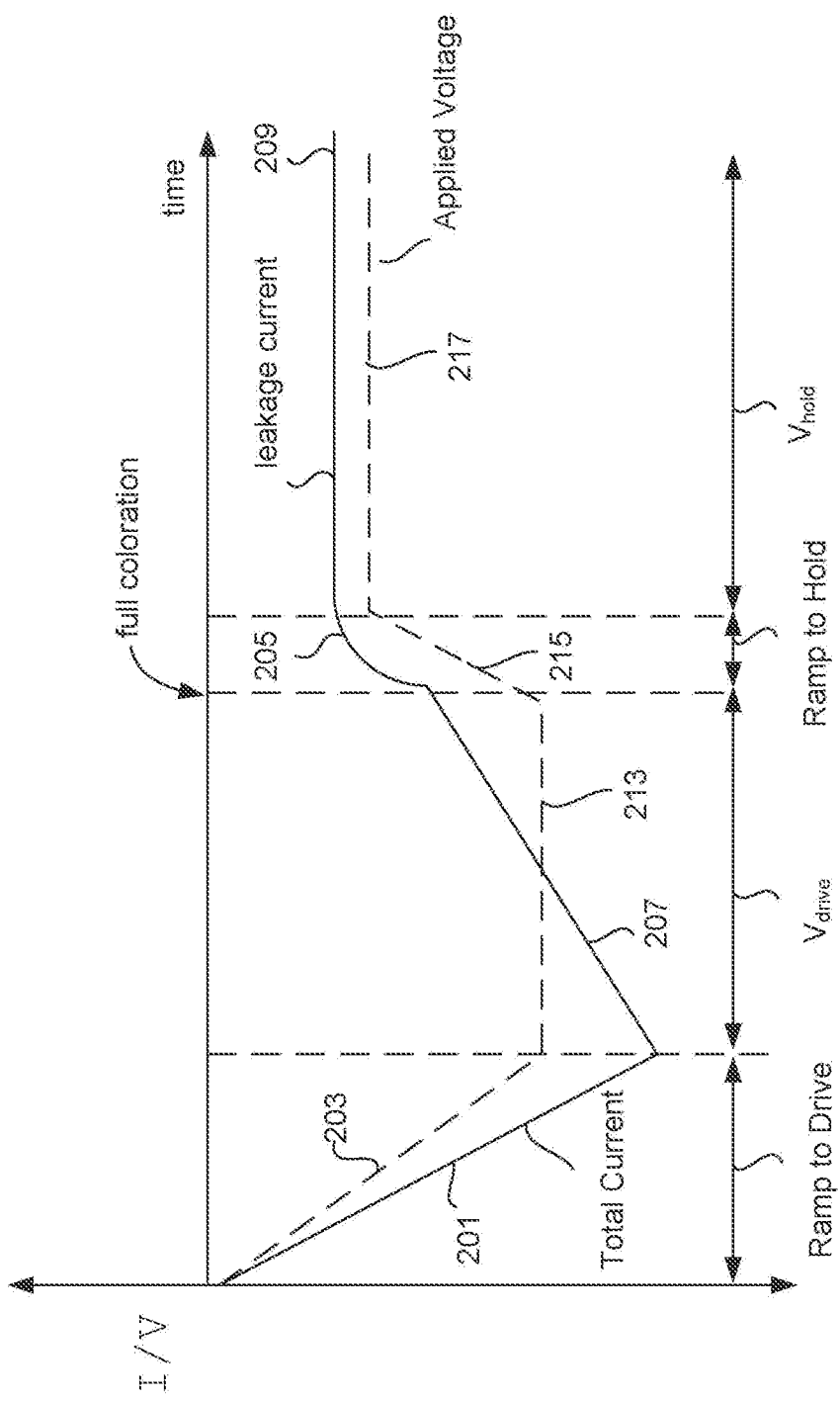
FIG. 2 is a graph illustrating an implementation of a voltage and current profile associated with driving an electrochromic device from a clear state to a tinted state.

To speed along optical transitions, the applied voltage is initially provided at a magnitude greater than that required to hold the device at a particular optical state in equilibrium. This approach is illustrated in FIGS. 1 and 2. FIG. 1 is a graph depicting voltage and current profiles associated with driving an electrochromic device from a clear state to a tinted state and from a tinted state to a clear state. FIG. 2 is a graph depicting certain voltage and current profiles associated with driving an electrochromic device from a tinted state to a clear state. Further, as used herein, the terms clear and bleached are used interchangeably when referring to the optical state of the electrochromic device of an IGU, as are the terms tinted and colored.

FIG. 1 shows a complete current profile and voltage profile for an electrochromic device employing a simple voltage control algorithm to cause an optical state transition cycle (coloration followed by bleaching) of an electrochromic device. In the graph, total current density (I) is represented as a function of time. As mentioned, the total current density is a combination of the ionic current density associated with an electrochromic transition and electronic leakage current between the electrochemically active electrodes. Many different types of electrochromic device will have the depicted current profile. In one example, a cathodic electrochromic material such as tungsten oxide is used in conjunction with an anodic electrochromic material such as nickel tungsten oxide in counter electrode. In such devices, negative currents indicate coloration of the device. In one example, lithium ions flow from a nickel tungsten oxide anodically coloring electrochromic electrode into a tungsten oxide cathodically coloring electrochromic electrode. Correspondingly, electrons flow into the tungsten oxide electrode to compensate for the positively charged incoming lithium ions. Therefore, the voltage and current are shown to have a negative value.

The depicted profile results from ramping up the voltage to a set level and then holding the voltage to maintain the optical state. The current peaks 101 are associated with changes in optical state, i.e., coloration and bleaching. Specifically, the current peaks represent delivery of the ionic charge needed to color or bleach the device. Mathematically, the shaded area under the peak represents the total charge required to color or bleach the device. The portions of the curve after the initial current spikes (portions 103) represent electronic leakage current while the device is in the new optical state.

In the figure, a voltage profile 105 is superimposed on the current curve. The voltage profile follows the sequence: negative ramp 107, negative hold 109, positive ramp 111, and positive hold 113. Note that the voltage remains constant after reaching its maximum magnitude and during the length of time that the device remains in its defined optical state. Voltage ramp 107 drives the device to its new the colored state and voltage hold 109 maintains the device in the colored state until voltage ramp 111 in the opposite direction drives the transition from colored to bleached states. In some implementations, voltage holds 109 and 113 may also be referred to as $V_{drive}$. In some switching algorithms, a current cap is imposed. That is, the current is not permitted to exceed a defined level in order to prevent damaging the device (e.g., driving ion movement through the material layers too quickly can physically damage the material layers). The coloration speed is a function of not only the applied voltage, but also the temperature and the voltage ramping rate.

FIG. 2 illustrates a voltage control profile in accordance with certain embodiments. In the depicted embodiment, a voltage control profile is employed to drive the transition from a bleached state to a colored state (or to an intermediate state). To drive an electrochromic device in the reverse direction, from a colored state to a bleached state (or from a more colored to less colored state), a similar but inverted profile is used. In some embodiments, the voltage control profile for going from colored to bleached is a mirror image of the one depicted in FIG. 2.

The voltage values depicted in FIG. 2 represent the applied voltage ($V_{app}$) values. The applied voltage profile is shown by the dashed line. For contrast, the current density in the device is shown by the solid line. In the depicted profile, $V_{app}$ includes four components: a ramp to drive component 203, which initiates the transition, a $V_{drive}$ component 213, which continues to drive the transition, a ramp to hold component 215, and a $V_{hold}$ component 217. The ramp components are implemented as variations in $V_{app}$ and the $V_{drive}$ and $V_{hold}$ components provide constant or substantially constant $V_{app}$ magnitudes.

The ramp to drive component is characterized by a ramp rate (increasing magnitude) and a magnitude of $V_{drive}$. When the magnitude of the applied voltage reaches $V_{drive}$, the ramp to drive component is completed. The $V_{an}$ component is characterized by the value of $V_{drive}$ as well as the duration of $V_{drive}$. The magnitude of $V_{drive}$ may be chosen to maintain $V_{eff}$ with a safe but effective range over the entire face of the electrochromic device as described above.

The ramp to hold component is characterized by a voltage ramp rate (decreasing magnitude) and the value of $V_{hold}$ (or optionally the difference between Va., and $V_{hold}$). $V_{app}$ drops according to the ramp rate until the value of $V_{hold}$ is reached. The $V_{hold}$ component is characterized by the magnitude of $V_{hold}$ and the duration of $V_{hold}$. Actually, the duration of $V_{hold}$ is typically governed by the length of time that the device is held in the colored state (or conversely in the bleached state). Unlike the ramp to drive, $V_{drive}$, and ramp to hold components, the $V_{hold}$ component has an arbitrary length, which is independent of the physics of the optical transition of the device.

Each type of electrochromic device will have its own characteristic components of the voltage profile for driving the optical transition. For example, a relatively large device and/or one with a more resistive conductive layer will require a higher value of $V_{drive}$ and possibly a higher ramp rate in the ramp to drive component. Larger devices may also require higher values of $V_{hold}$. U.S. patent application Ser. No. 13/449,251, titled "CONTROLLER FOR OPTICALLY-SWITCHABLE WINDOWS," filed Apr. 17, 2012 (Attorney Docket No. VIEWP042), and incorporated herein by reference, discloses controllers and associated algorithms for driving optical transitions over a wide range of conditions. As explained therein, each of the components of an applied voltage profile (ramp to drive, $V_{drive}$, ramp to hold, and $V_{hold}$, herein) may be independently controlled to address real-time conditions such as current temperature, current level of transmissivity, etc. In some embodiments, the values of each component of the applied voltage profile is set for a particular electrochromic device (having its own bus bar separation, resistivity, etc.) and does vary based on current conditions. In other words, in such embodiments, the voltage profile does not take into account feedback such as temperature, current density, and the like.

As indicated, all voltage values shown in the voltage transition profile of FIG. 2 correspond to the $V_{app}$ values described above. They do not correspond to the $V_{eff}$ values described above. In other words, the voltage values depicted in FIG. 2 are representative of the voltage difference between the bus bars of opposite polarity on the electrochromic device.

In certain embodiments, the ramp to drive component of the voltage profile is chosen to safely but rapidly induce ionic current to flow between the electrochromic and counter electrodes. As shown in FIG. 2, the current in the device follows the profile of the ramp to drive voltage component until the ramp to drive portion of the profile ends and the $V_{drive}$ portion begins. See current component 201 in FIG. 2. Safe levels of current and voltage can be determined empirically or based on other feedback. U.S. Pat. No. 8,254,013, titled "CONTROLLING TRANSITIONS IN OPTICALLY SWITCHABLE DEVICES," filed Mar. 16, 2011 (Attorney Docket No. VIEWP009), is incorporated herein by reference and presents examples of algorithms for maintaining safe current levels during electrochromic device transitions.

In certain embodiments, the value of $V_{drive}$ is chosen based on the considerations described above. Particularly, it is chosen so that the value of $V_{eff}$ over the entire surface of the electrochromic device remains within a range that effectively and safely transitions large electrochromic devices. The duration of $V_{drive}$ can be chosen based on various considerations. One of these ensures that the drive potential is held for a period sufficient to cause the substantial coloration of the device. For this purpose, the duration of $V_{drive}$ may be determined empirically, by monitoring the optical density of the device as a function of the length of time that $V_{drive}$ remains in place. In some embodiments, the duration of $V_{drive}$ is set to a specified time period. In another embodiment, the duration of $V_{drive}$ is set to correspond to a desired amount of ionic charge being passed. As shown, the current ramps down during $V_{drive}$. See current segment 207.

Another consideration is the reduction in current density in the device as the ionic current decays as a consequence of the available lithium ions completing their journey from the anodic coloring electrode to the cathodic coloring electrode (or counter electrode) during the optical transition. When the transition is complete, the only current flowing across device is leakage current through the ion conducting material. As a consequence, the ohmic drop in potential across the face of the device decreases and the local values of $V_{eff}$ increase. These increased values of $V_{eff}$ can damage or degrade the device if the applied voltage is not reduced. Thus, another consideration in determining the duration of $V_{drive}$ is the goal of reducing the level of $V_{eff}$ associated with leakage current. By dropping the applied voltage from $V_{drive}$ to $V_{hold}$, not only is $V_{eff}$ reduced on the face of the device but leakage current decreases as well. As shown in FIG. 2, the device current transitions in a segment 205 during the ramp to hold component. The current settles to a stable leakage current 209 during $V_{hold}$.

Insulated Glass Unit Formation

Figure 3:
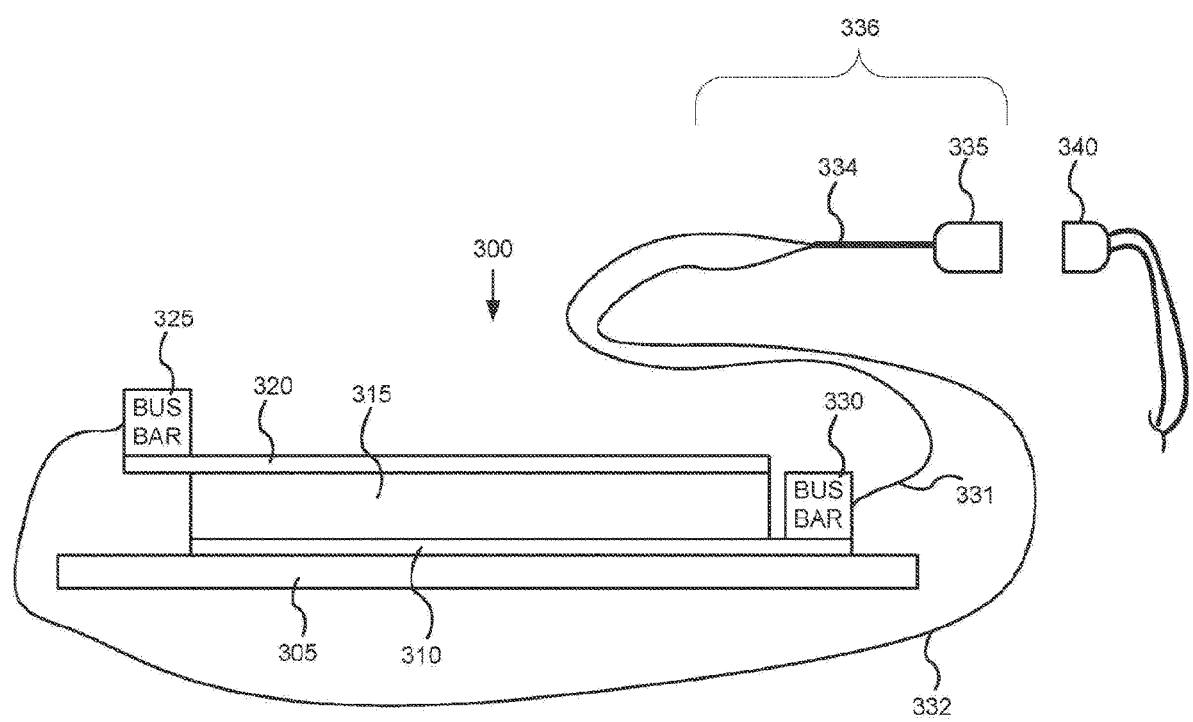
FIG. 3 is a cross-sectional schematic of an electrochromic device.

To apply voltage control algorithms, there may be associated wiring and connections to the electrochromic device being powered. FIG. 3 shows an example of a cross-sectional schematic drawing of an electrochromic device, 300. Electrochromic device 300 includes a substrate, 305. The substrate may be transparent and may be made of, for example, glass. A first transparent conducting oxide (TCO) layer, 310, is on substrate 305, with first TCO layer 310 being the first of two conductive layers used to form the electrodes of electrochromic device 300. Electrochromic stack 315 may include (i) an electrochromic (EC) layer, (ii) ion conducting (IC) material, and (iii) a counter electrode (CE) layer to form a stack in which the IC layer separates the EC layer and the CE layer. Electrochromic stack 315 is sandwiched between first TCO layer 310 and a second TCO layer, 320, TCO layer 320 being the second of two conductive layers used to form the electrodes of electrochromic device 300. First TCO layer 310 is in contact with a first bus bar, 330, and second TCO layer 320 is in contact with a second bus bar, 325. Wires, 331 and 332, are connected to bus bars 330 and 325, respectively, and form a wire assembly 334 which terminates in a connector, 335. Wire assembly 334 and connector 335 are collectively known as a pigtail 336. Wires 331 and 332 may also be considered part of the pigtail 336 in the sense that wires 331 and 332 may be braided and have an insulated cover over them (or other additional wires in some implementations), such that multiple wires form a single cord, i.e., the wire assembly 334 and thus pigtail 336. Wires of another connector, 340, may be connected to a tester or controller that is capable of effecting a transition of electrochromic device 300, e.g., from a first optical state to a second optical state. Pigtail 336 and 340 may be coupled, such that the tester or controller may drive the optical state transition for electrochromic device 300.

Figure 4A:
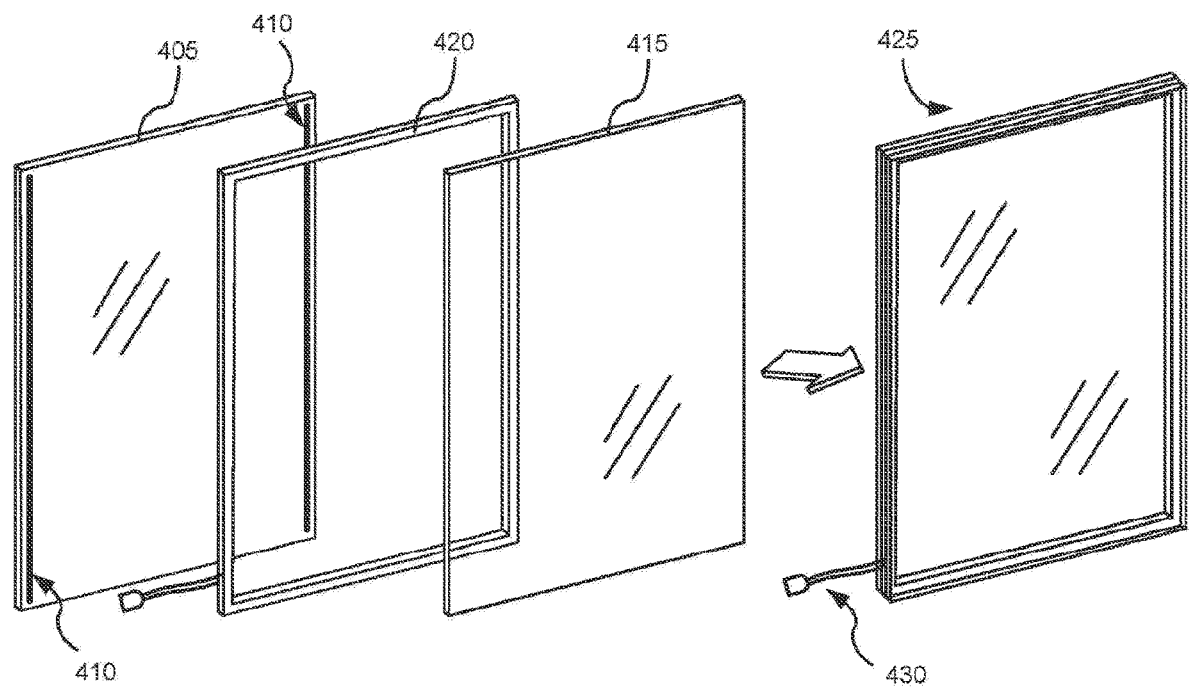
FIG. 4A depicts an example of the operations for fabricating an insulated glass unit.
Figure 4B:
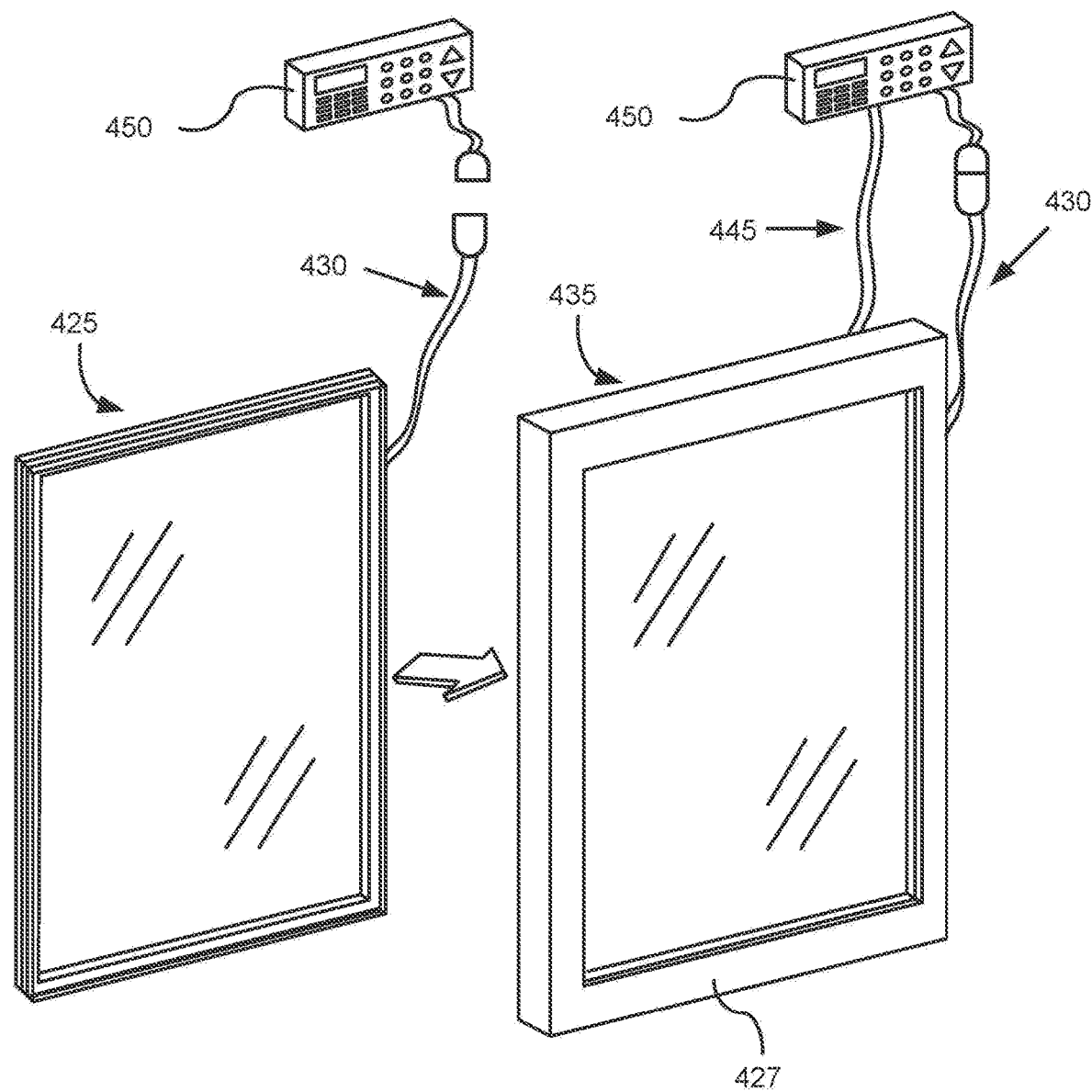
FIG. 4B depicts an example of incorporating an insulated glass unit into a frame.

In accordance with voltage algorithms and associated wiring and connections for powering an electrochromic device, there are also aspects of how the wired electrochromic glazing is incorporated into an IGU and how the IGU is incorporated into, e.g., a frame. FIGS. 4A and 4B show examples of the operations for fabricating an IGU, 425, including an electrochromic pane, 405, and incorporating the IGU 425 into a frame, 427. Electrochromic pane 405 has an electrochromic device (not shown, but for example on surface A) and bus bars, 410, which provide power to the electrochromic device, is matched with another glass pane, 415. The electrochromic pane may include, for example, an electrochromic device similar to the electrochromic device shown in FIG. 3, as described above. In some embodiments, the electrochromic device is solid state and inorganic.

Referring to FIG. 4A, during fabrication of IGU 425, a separator, 420 is sandwiched in between and registered with glass panes 405 and 415. IGU 425 has an associated interior space defined by the faces of the glass panes in contact with separator 420 and the interior surfaces of the separator. Separator 420 may be a sealing separator, that is, the separator may include a spacer and sealing material (primary seal) between the spacer and each glass pane where the glass panes contact the separator. Separator 420 may be a pre-wired spacer (discussed below), where pigtail 430 is ran through and ultimately protrudes from the spacer. A sealing separator together with the primary seal may seal, e.g., hermetically, the interior volume enclosed by glass panes 405 and 415 and separator 420 and protect the interior volume from moisture and the like. Once glass panes 405 and 415 are coupled to separator 420, a secondary seal may be applied around the perimeter edges of IGU 425 in order to impart further sealing from the ambient environment, as well as further structural rigidity to IGU 425. The secondary seal may be a silicone based sealant, for example.

Referring to FIG. 4B, IGU 425 may be wired to a window controller or tester, 450, via a pigtail, 430. Pigtail 430 includes wires electrically coupled to bus bars 410 and may include other wires for sensors or for other components of IGU 425. As stated above, insulated wires in a pigtail 430 may be braided and have an insulated cover over all of the wires (power, sensor, communications, etc.), such that the multiple wires form a single cord or wire assembly. IGU 425 may be mounted in frame 427 to create a window assembly, 435. Window assembly 435 is connected, via pigtail 430, to window controller, 450. Window controller 450 may also be connected to one or more sensors in frame 427 with one or more communication lines, 445. During fabrication, transportation, and installation of IGU 425, care must be taken, e.g., due to the fact that glass panes may be fragile but also because pigtail 430 extends beyond the IGU glass panes and may be damaged.

Figure 5A:
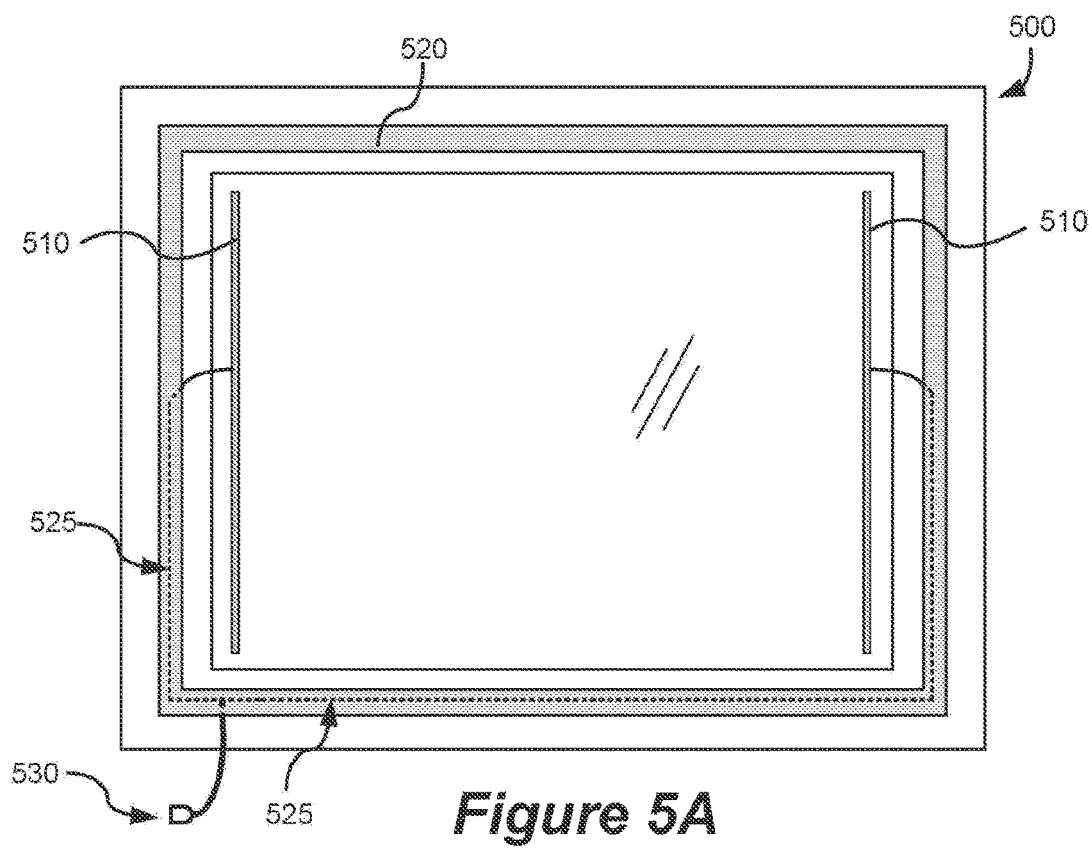
FIG. 5A shows one implementation for wiring an insulated glass unit.
Figure 5B:
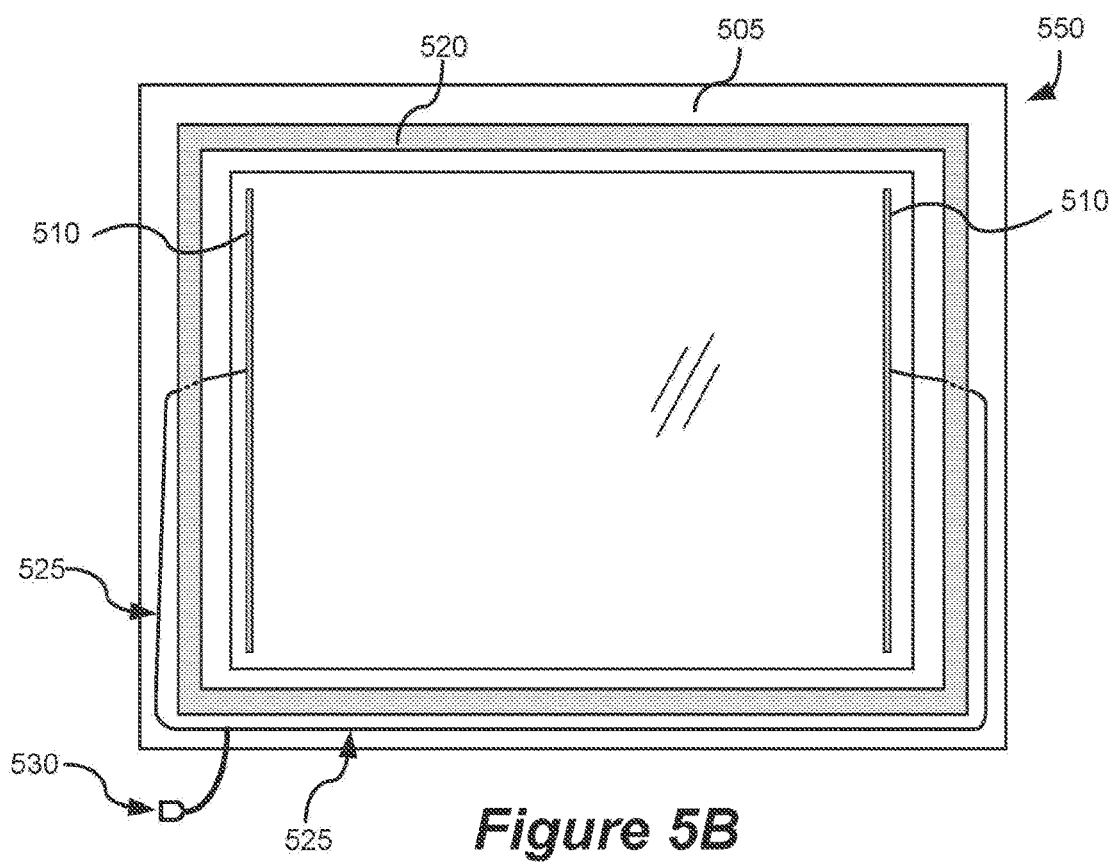
FIG. 5B shows another implementation for wiring an insulated glass unit.

FIG. 5A depicts an IGU 500 with a separator 520 as a pre-wired spacer, where wires 525 make contact with the bus bars 510, then pass through the body of the spacer 520 to form the pigtail 530. Pre-wired spacers are further described in "CONNECTORS FOR SMART WINDOWS", PCT International Application No. PCT/US12/68950, filed Dec. 11, 2012 (Attorney Docket No. VIEWP034X1WO), which is hereby incorporated by reference in its entirety and for all purposes. FIG. 5B depicts an alternative IGU setup 550, where wires 525 are run in the secondary seal area 505, external to the spacer 520.

Pigtail and Pigtail Cap

In certain implementations, a pigtail or other IGU connector includes a chip which includes memory and/or logic, e.g., in connector 335 in FIG. 3. This memory is programmed from the factory to contain window parameters, or fingerprints, that allow a tester or window controller to determine appropriate drive voltages for the electrochromic coating associated with the window. Other relevant fingerprint parameters include voltage response, current response, drive parameters, communications fidelity, window dimensions, and lite or window IDs. A site monitoring system for electrochromic window networks may reprogram the memory in the pigtail (or other memory) remotely and automatically in certain embodiments while a field monitoring system runs in the cloud and collects data from the different sites. Fingerprints and site monitoring systems for electrochromic window networks are described in "MONITORING SITES CONTAINING SWITCHABLE OPTICAL DEVICES AND CONTROLLERS," PCT International Application No. PCT/US2015/019031, filed Mar. 5, 2015 (Attorney Docket No. VIEWP061WO), which is hereby incorporated by reference in its entirety.

Figure 12:
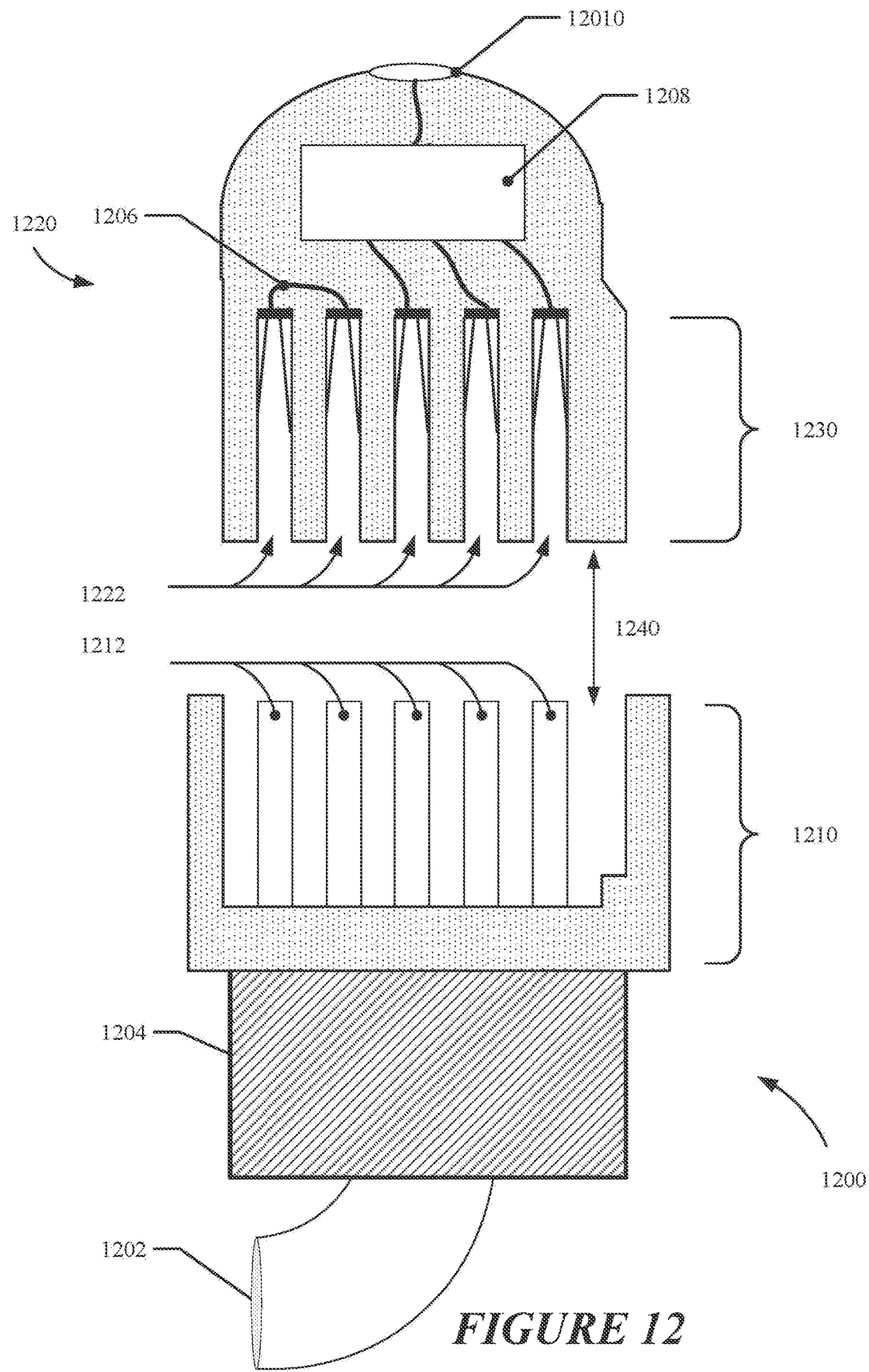
FIG. 12 illustrates a cross-sectional view of an interface between an IGU connector and a cap.

FIG. 12 depicts an example interface between an IGU connector 1200 and a pigtail cap 1220 according to some implementations. The IGU connector has a connection interface 1210 which is configured to mate with the connection interface of the pigtail cap 1230. The connector may have a plurality of pins 1212 used to transfer information and/or power between the IGU and an attached device (e.g., a tester, a window controller, or a pigtail cap). Pins for delivering power to the electrochromic window may deliver charge via wiring 1202. Pins used to transfer information may be connected to window sensors, e.g., through wiring 1202, or connected to a memory storage device 1204 associated with the connector. The memory associated with a connector may store window parameters including parameters used for controlling an electrochromic device, or parameters which may be used to compare current window conditions to a previous window conditions (e.g., using voltage and/or current response data). The pigtail cap 1220, has female contacts 1222 which are configured to accept the pins of the connector. The pigtail cap need not have female-connectors; mixed male/female connectors and other types of connection interfaces between an IGU connector and a pigtail cap are also contemplated. In some cases, the cap and connector will have a keying interface 1240 or some asymmetric feature which is used to orient mating of the pigtail cap to the IGU connector. In some implementations, the cap is configured to short the leads of the pigtail that are used to provide charge to the electrochromic device when the cap is attached—allowing current to drain from the electrochromic device. This may be implemented by wire 1206, or another conductor, placed between contacts of the pigtail cap 1222. Shorting the IGU connector or pigtail leads that connect to the EC and CE layers of the electrochromic device cause the IGU to clear more quickly than an IGU would clear otherwise. In some cases, an IGU cap may cause an IGU completely clear, where depending on the amount of tint present, a clear state can be achieved on the order of hours or minutes, rather than days. Total IGU discharging time will vary according to size and native leakage levels, but total IGU is discharging time should be less than the transit time from the factory or manufacturer to a customer site. An IGU connector or pigtail may have multiple pins (1212) and/or sockets (not depicted), e.g., a 5-pin connector as described in U.S. patent application Ser. No. 15/268,204, titled "POWER DISTRIBUTION NETWORKS FOR ELECTROCHROMIC DEVICES," filed Sep. 16, 2016 (Attorney Docket No. VIEWP085), which is incorporated herein in its entirety. In some cases resistor may be included in the circuit, e.g., in series with wire 1206, to drain the device at a specified rate. In some embodiments a pigtail cap may include circuitry 1208 that detects if the IGU is completely drained of charge so that the IGU is in a clear state. Once the IGU is drained of charge, an indicator, e.g., LED 12010, may designate that the window has been cleared of tinting. Connection interface 1230 may couple with an IGU connector or pigtail in a push-on or snap-fit fashion, or any other type of mechanical connection.

Figure 6A:
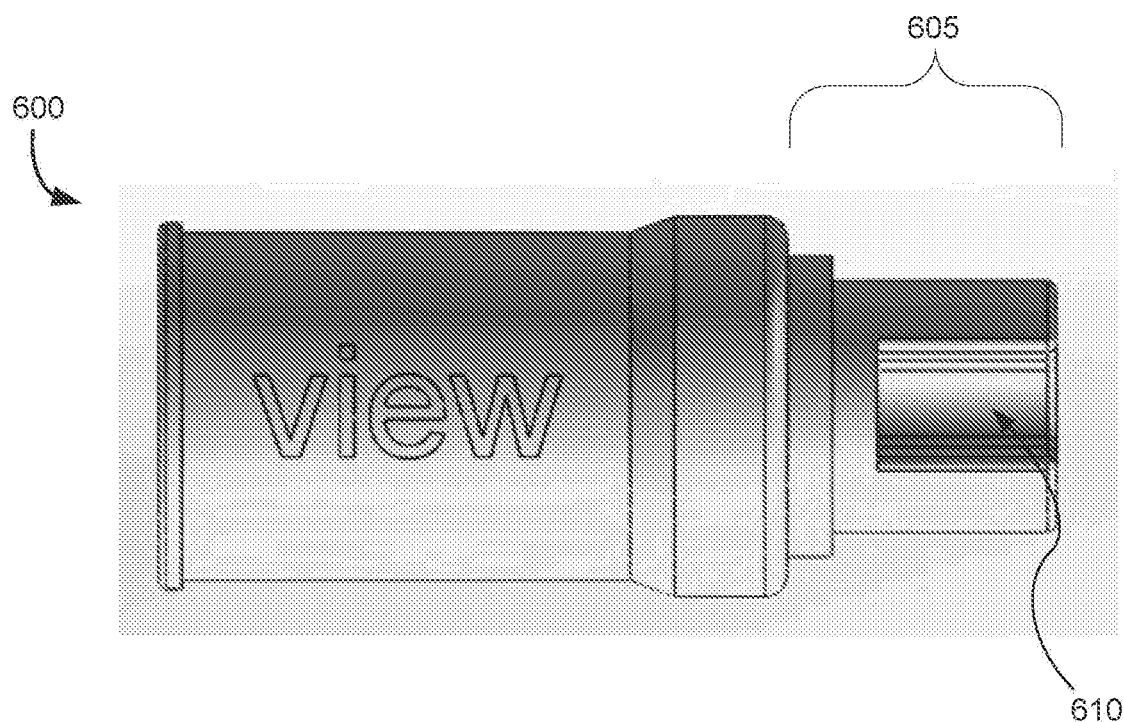
FIG. 6A displays a profile view of a pigtail cap.
Figure 6B:
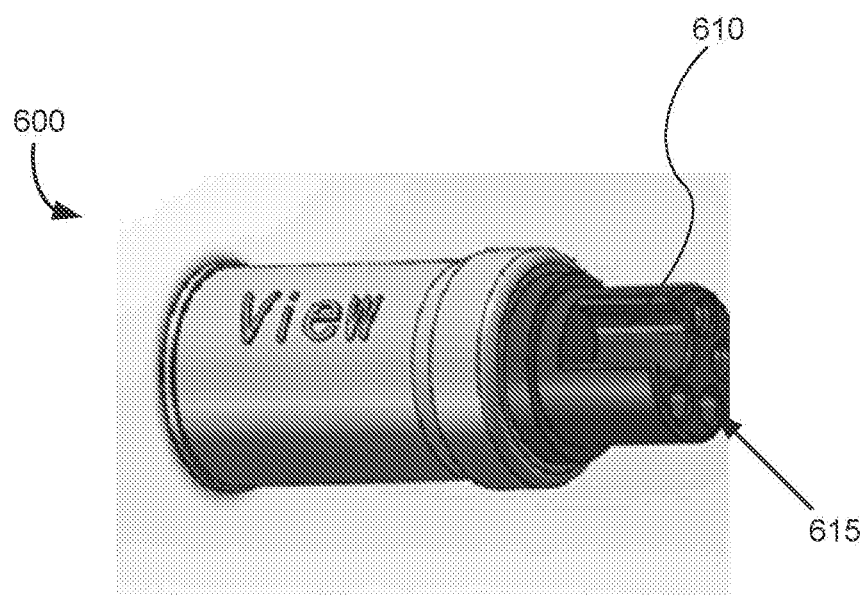
FIG. 6B displays an alternate view of a pigtail cap.

FIGS. 6A and 6B depict different aspects of a pigtail cap according to some implementations. Pigtail cap 600 includes a connection interface 605 (corresponding to 1230 in FIG. 12) that is configured to mate with a pigtail. The connection interface 605 may include a keying interface 610 (corresponding to 1240 in FIG. 12) which is used to orient the pigtail cap 600 such that and contacts 615 are aligned with the corresponding leads from the pigtail. As depicted contacts on pigtail cap 615 may be spatially arranged in a circular pattern, however, this is not necessary. For example, contacts may be arranged in a linear fashion as depicted in FIG. 12, or any other fashion.

Once a pigtail cap couples with a pigtail, the pigtail cap protects the pigtail from debris. A pigtail cap is typically coupled with a pigtail at the factory before the IGU is ready to be shipped out, thus the pigtail cap protects the pigtail from collecting debris such as dirt and grime inside of its connector at the factory, in transit, or at the installation site and protects the leads of a pigtail from getting damaged. The inexpensive pigtail caps can be disposed of once the IGU is ready for installation or returned to the manufacturer for future use.

In some implementations (not shown), the pigtail cap may attach with the IGU via an attachment component to protect the pigtail, e.g., wire assembly 334 and connector 335 in FIG. 3, from damage and to protect the IGU from damage or scratches inflicted by the pigtail. In one implementation, a clip, e.g., a U-channel clip, is used to fasten the pigtail cap coupled with the pigtail to an edge or surface of the IGU to prevent the pigtail from flailing about while the IGU is in transit. In another implementation, the pigtail cap and pigtail may reside in the secondary seal region of an IGU, e.g., secondary seal area 505 in FIG. 5B.

Further benefits of pigtail caps relate to their efficiency in the deployment cycle. Because floor space and time in a factory are valuable, by leveraging time an IGU is in transit to drain current from the IGU, the IGU is out the door faster, and factory floor space is freed up for other operations. Furthermore, by draining the current from IGUs such that they arrive at their installation site in a clear state, testing an IGU at an installation site will be that much easier as all IGUs will be starting from the same initial clear or bleached state, ensuring a more uniform tint state across tested IGUs at the conclusion of testing. This allows easier lite to lite matching right out of the box and reassures anyone working with or purchasing the IGUs who might be concerned that their IGUs do not look the same due to varying tint levels the IGUs may come in if not uniformly drained of all current. Thus the IGUs can be shipped with the pigtail cap installed, e.g., in various tint states, and they will arrive at the installation site all the in the clear or bleached state and with the pigtails protected.

Tester

IGUs are generally installed before an electrochromic window network, including the power distribution and communications networks involved therein are configured. In some implementations, a pigtail or other IGU connector is used to connect wiring from an IGU to a tester before and after installation to verify working window performance. A tester may also be used to test IGUs at a factory, a manufacturer, or any other appropriate setting.

After IGUs have reached their destination installation site, a glazier, or other technician, may do an initial test with a portable tester to assess whether the IGUs are functioning properly. If the initial test discovers that an IGU is not in working order, the glazier will know that the IGUs were damaged in transit and may notify the appropriate individuals involved with the site installation (e.g., building managers, manufacturers, etc.) of the problem. In some embodiments, the tester may automatically send test results, e.g., through wireless communication means, to the appropriate individuals so that a new IGU of the same specification as the IGU with problems can be ordered and shipped so that the site installation deployment time is minimally impacted. After the glazier installs an IGU, the glazier may again use the portable tester to confirm that the IGU is functioning properly. The data that a glazier acquires from testing each IGU may later be utilized in commissioning, where physical locations and network IDs of IGUs are paired together to bring the control system of an electrochromic window online. Logs of the test data may be sent to a site monitoring system, e.g., to provide a fingerprint or otherwise a baseline for the history of the IGUs EC device performance.

Figure 7A:
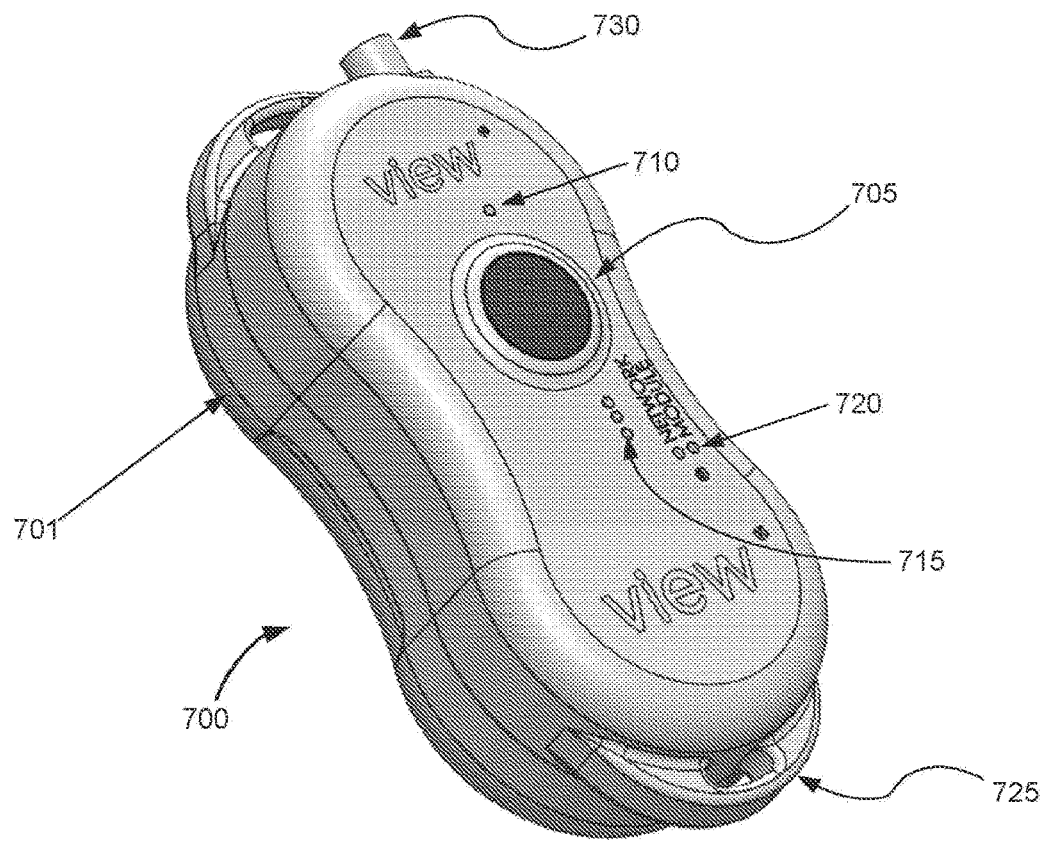
FIG. 7A depicts a tester used to check if an insulated glass unit is operating properly.
Figure 7B:
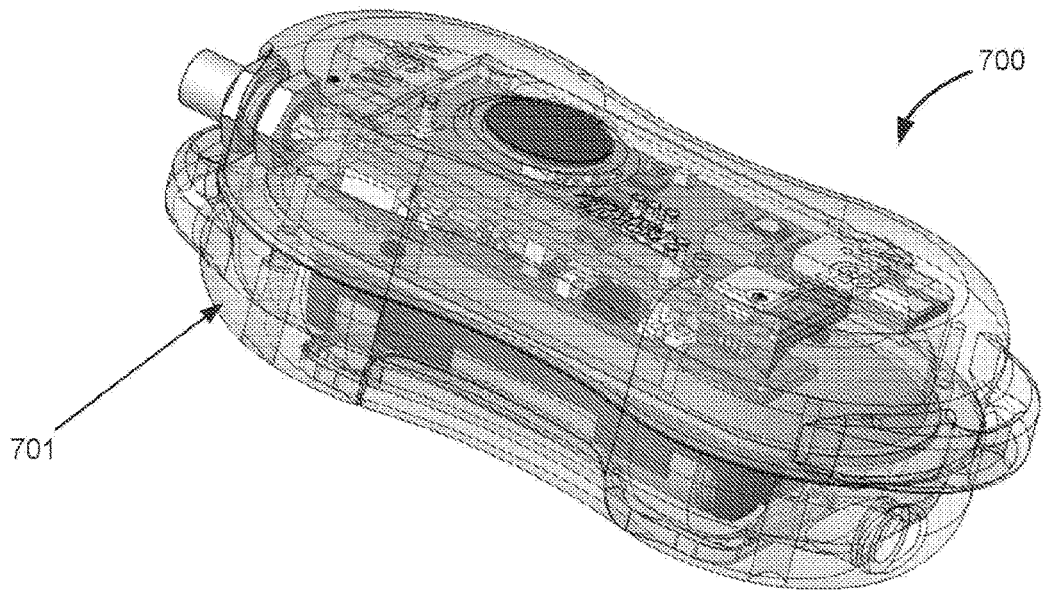
FIG. 7B depicts a view of a tester with a transparent housing.

FIGS. 7A and 7B illustrate examples of external views of a tester. FIG. 7A shows tester 700 with a housing 701 including the depicted exterior components thereon. Tester 700 has a port 730 that can couple to a pigtail or other IGU connector.

In certain implementations, the port may communicate with a window via two contacts (not depicted) that are used to provide charge to the electrochromic device of the IGU. In another implementation, the port may comprise additional pins, for example, 5 pins of a 5-pin connector. In some embodiments two contacts are used to power the electrochromic device while other pins are used for communication between the tester and the pigtail. Port 730 may couple with a pigtail connector with any type of mechanical connection that maintains electrical coupling between the contacts in port 730 and the IGU connector. For example the mechanical connection may be a push-on, twist-on, or snap-fit connection. Tester 700 may be powered on and off by through the input interface button 705, e.g., where a short press of button 705 turns on tester 700 and a long press of about four seconds of button 705 turns off the tester 700. Once tester 700 is turned on, another short press of button 705 may initiate testing of the IGU. While the device depicted in FIG. 7A and 7B receives user input via button 705, other input interfaces such as a touch-sensitive graphical user interface may be used. In some embodiments, a tester may receive user input provided by a user operating a remote device such as a tablet or mobile phone. Once tester 700 is connected to a pigtail and powered on, optional status indicators 720, e.g., LEDs, will indicate the current status of tester, which include (i) reading the pigtail for fingerprints and other parameters, (ii) IGU test is in progress, and (iii) idle. Tester 700 may also determine whether a lite ID matches a site ID to check if an IGU has been shipped to the correct location. While the status indicator is depicted as an LED on the exterior of the surface of the tester, LED indicators may also be located within the housing when the housing is transparent or translucent. In some embodiments, a securing interface 725 may be made from a translucent material that reflects the color of an LED indicator. In some embodiments, the indicator may be an audible indicator (e.g., if the tester has a speaker unit), and in some embodiments, the tester may be configured to transmit wireless signals with instructions for another device, e.g., a phone or tablet to provide the status of an IGU to a user.

After tester 700 is powered on and finished reading the pigtail, the IGU test may be initiated via button 705 and completed, e.g., in about 10 seconds or less. The tester applies an aggressive driving voltage profile, i.e., a steeper voltage ramp rates and shorter voltage hold times depending on the magnitude of $V_{drive}$ than FIG. 1, to the connected IGU, but the tester need not actually tint the IGU. In some implementations, with reference to voltage profile 105 in FIG. 1, an aggressive driving voltage profile tints then clears an IGU and includes a negative voltage ramp 107 and positive voltage ramp 111 lasting, e.g., a fraction of a second long, a negative voltage hold 109 and positive voltage hold 113 lasting, e.g., a second long, and a $V_{drive}$ with a magnitude between, e.g., 0.1 V and 5 V. A tester 700 may also test an IGU by applying a clearing voltage first then a tinting voltage second. The tester calculates the current density of the IGU based off of the voltage supplied to the IGU, the current consumed by the IGU, and the IGU dimensions which may be read from the pigtail. Based on the calculated current density, the tester determines whether the IGU is functioning properly, i.e., passed or failed the test. For example, a tester might identify whether the current density is within an acceptable range, above a maximum threshold, or below a minimum threshold for an applied voltage profile to determine whether an IGU is functioning properly. After testing an IGU, tester 700 may indicate whether the IGU passed or failed the test via pass/fail indicator 710, e.g., a LED. The tester 700 may then be disconnected from the IGU connector or pigtail without having to be powered down since the tester goes into a high impedance mode at, e.g., 10 seconds after the test has been initiated. An IGU may fail the test if, e.g., there is an open or short in the electrochromic device that affects the performance of the electrochromic device and results in out of range current densities. Battery indicators 715, e.g., LEDs, show the remaining battery life of tester 700. Securing interface 725 allows for glaziers to secure tester 700 to their persons or utility belts, via, e.g., a carabiner, lanyard, or other connection means.

FIG. 7B shows an alternative view of tester 700, where the housing 701 is transparent so that the orientation of the interior components of tester 700 may be observed. The discussion of the interior components of tester 700 is continued in FIG. 8.

Figure 8:
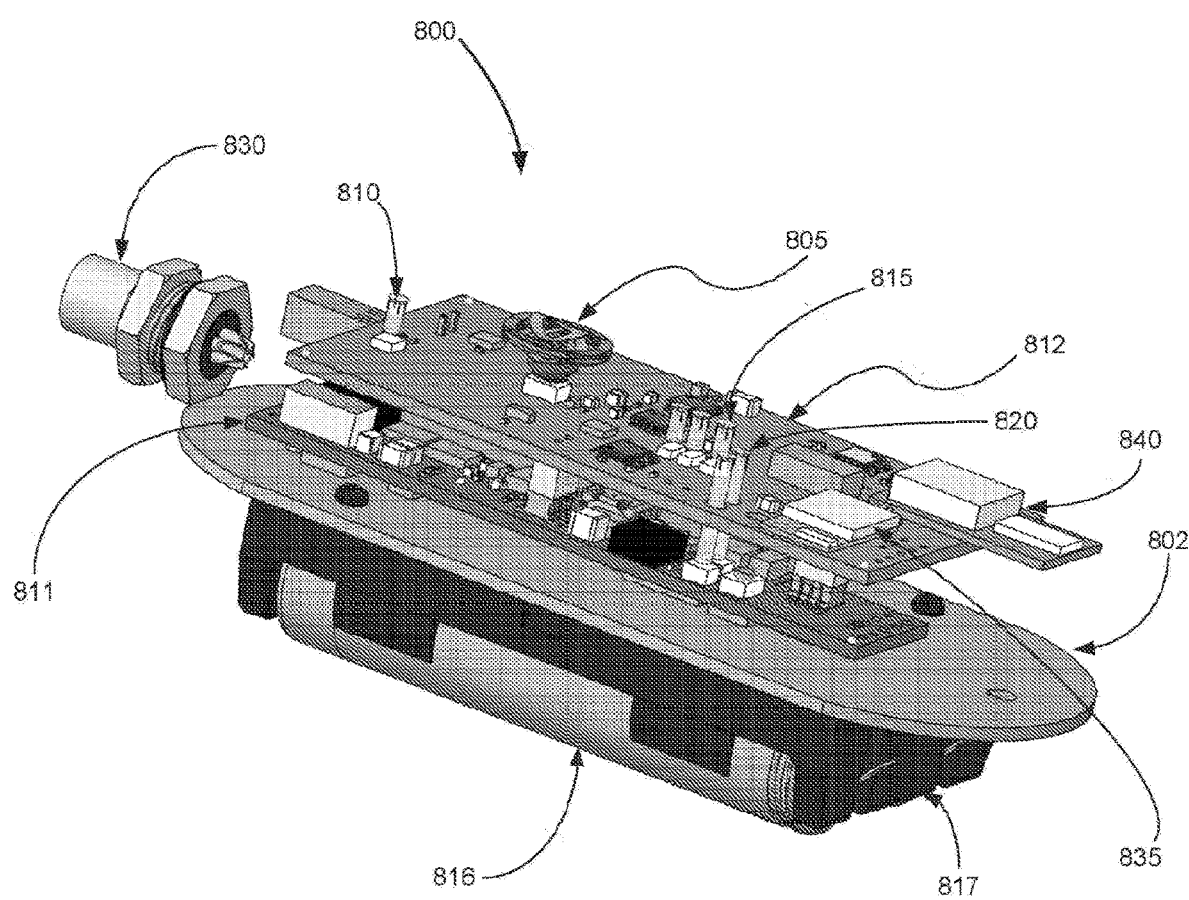
FIG. 8 displays the interior components of a tester.

FIG. 8 displays the interior components 800 of tester 700. Port 830, which corresponds to port 730 from FIG. 7, is electrically coupled (e.g., by wiring, not shown) to controller 811. Interior button components 805 shows where button 705 from FIG. 7 couples with the rest of the interior components 800, e.g., at daughter card 812. Similarly, indicators, e.g., LEDs, such as pass/fail indicator 810, battery indicator 815, and status indicator 820 show where pass/fail indicator 710, battery indicator 715, and status indicator 720 couple with the rest of the interior components 800, e.g., at daughter card 812, respectively. Daughter card 812 contains circuitry to increase the number of digital inputs and output points of controller 811, such as, e.g., inputs to read button 705 and outputs to drive the indicators 710, 715, and 720. In some implementations, daughter card 812 may monitor and control charging battery 816. In some implementations, daughter card 812 includes a communications module 835, e.g., Bluetooth Smart® or low energy radio, which enables wireless communication with mobile devices. Tester results and other relevant data may be transferred, e.g., automatically, to a mobile device via communications module 835 and a corresponding mobile device application. The tester results and relevant data may then be transferred to the appropriate individuals involved with the site installation, or alternatively, be uploaded to the cloud. In some implementations, daughter card 812 includes an ultra-wideband ("UWB") module 840, e.g., a DecaWave® radio, which has commissioning applications (discussed below). In some implementations, a daughter card may be connected to a UWB module that may be used for positioning and communication to a mobile device.

Controller 811 may have a circuitry for regulating current and/or voltage among the internal components 800. For example, the voltage supplied by the battery may be regulated to, e.g., 3.3 V. Similarly, the controller 811 may regulate the voltage or current provided to a daughter card, a communications module, or a UWB module. In some embodiments, controller 811 or daughter card 812 may include charging circuitry for charging rechargeable batteries.

Controller 811 operates the tester by applying an aggressive voltage driving profile to an IGU connected to port 830. As mentioned, the tester need not tint the IGU; instead, the controller 811 and/or daughter card 812 makes a calculation of the current density within the electrochromic device of the IGU based on the voltage being supplied to the IGU, the current being consumed by the IGU, and the dimensions of the IGU read from the pigtail to determine whether the IGU is operating correctly. While the depicted embodiment has both a controller and daughter card, it should be understood that this is just one of many possible configurations. For example, the components and features of the daughter card 812 may, in some embodiments, be integrated into controller 811. Components of the daughter card 812 may also be on the controller 811 and vice versa. For example, in some embodiments, a controller may include a communications module and a UWB module, if for instance these components are not on a daughter card, or if the interior components 800 do not include daughter card 812.

Batteries 816, e.g., Li-ion rechargeable batteries, provide the voltage to the tester and may allow the tester to operate continuously, e.g., for about 16 hours. Batteries 816 are coupled with via battery structure 817, which is coupled to support structure 802. Daughter card 812 couples with controller 811, which in turn couples with support structure 802, providing the tester with structural reinforcement and alignment.

Figure 11:
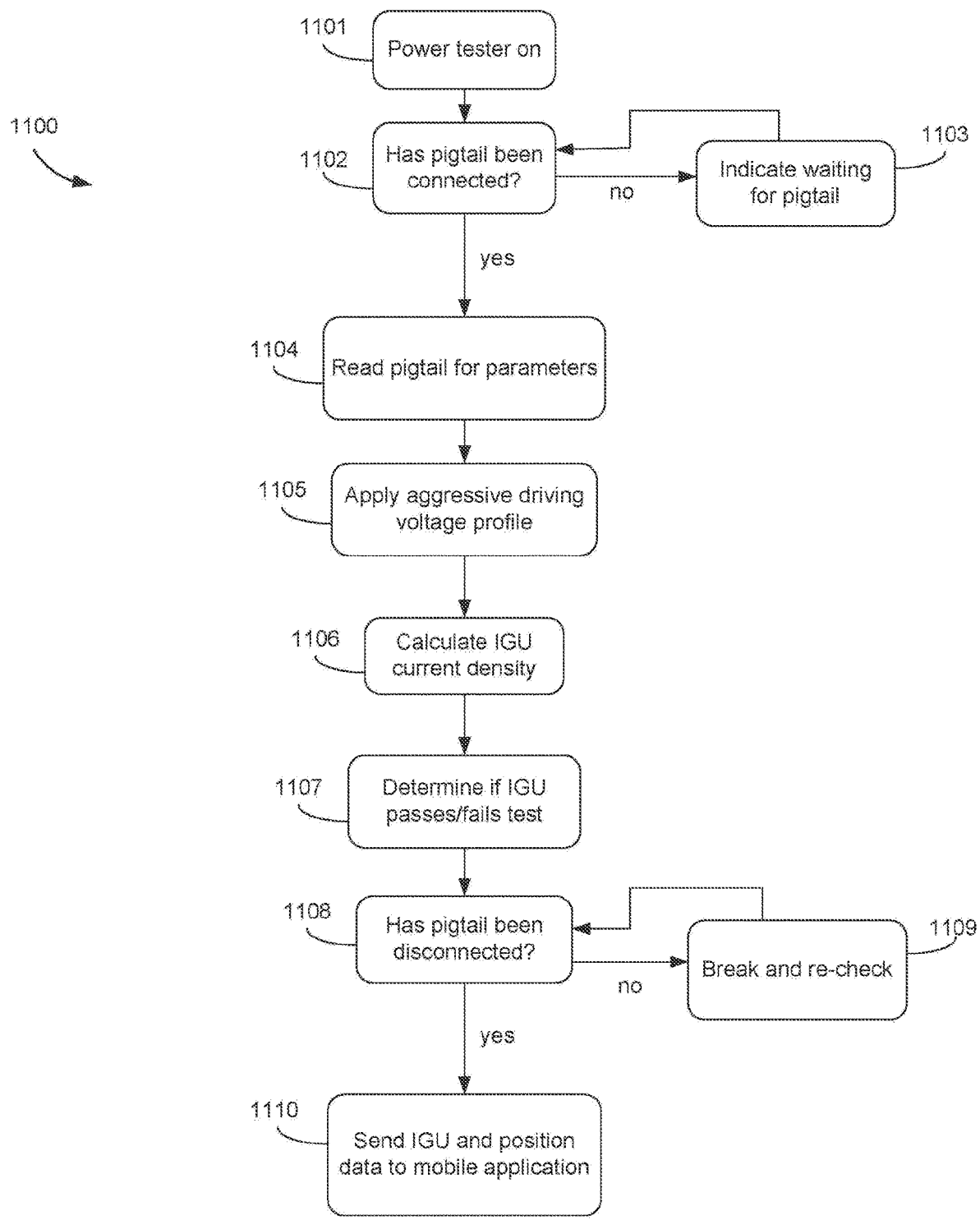
FIG. 11 illustrates a method of using an insulated glass unit tester.

FIG. 11 shows a method of using an IGU tester 1100. In step 1101, tester power is turned on. Next, in step 1102, the tester checks whether it is connected to a pigtail of an IGU. If not, a status indicator of the tester indicates that the tester is waiting for the pigtail in step 1103. In step 1104, the tester reads the pigtail for parameters, e.g., fingerprints, such as IGU dimensions, drive parameters, and lite ID. Next, in step 1105, the power button can be pressed once more to begin testing the IGU by applying an aggressive driving voltage profile. In step 1106, the tester calculates the current density in the IGU. In step 1107, depending on the measurements taken to calculate the current density of the connected IGU, the tester will determine if the IGU passes or fails. Next, in step 1108, the tester checks if the pigtail has been disconnected. If the pigtail has not been disconnected, the tester breaks off connection with the pigtail by going into a high impedance state and re-checks in step 1109. After the pigtail has been disconnected, the tester sends IGU and position data to a mobile application via a communications module.

Once a glazier is done testing each IGU installed, the rest of the site installation deployment may continue and window controller networks may be set up. The testing data that a glazier obtains is useful in commissioning the site (discussed below).

Window Controller Networks

Figure 9A:
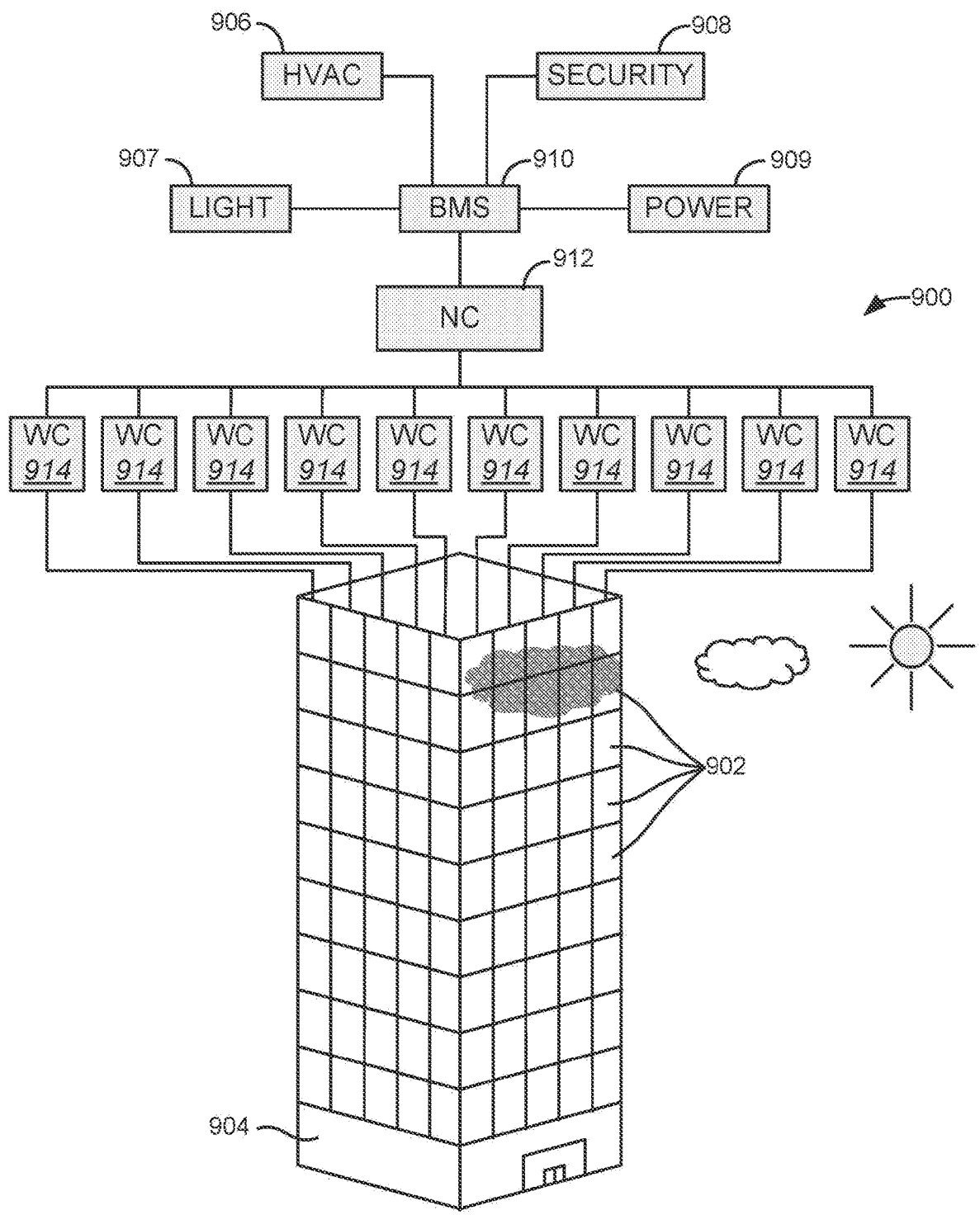
FIG. 9A shows a depiction of an example system for controlling and driving a plurality of electrochromic windows.

FIG. 9A shows a depiction of an example system 900 for controlling and driving a plurality of electrochromic windows 902. It may also be employed to control the operation of one or more devices associated with an electrochromic window such as a window antenna. The system 900 can be adapted for use with a building 904 such as a commercial office building or a residential building. In some implementations, the system 900 is designed to function in conjunction with modern heating, ventilation, and air conditioning ("HVAC") systems 906, interior lighting systems 907, security systems 908 and power systems 909 as a single holistic and efficient energy control system for the entire building 904, or a campus of buildings 904. Some implementations of the system 900 are particularly well-suited for integration with a building management system ("BMS") 910. The BMS 910 is a computer-based control system that can be installed in a building to monitor and control the building's mechanical and electrical equipment such as HVAC systems, lighting systems, power systems, elevators, fire systems, and security systems. The BMS 910 can include hardware and associated firmware or software for maintaining conditions in the building 904 according to preferences set by the occupants or by a building manager or other administrator. The software can be based on, for example, internet protocols or open standards.

A BMS can typically be used in large buildings where it functions to control the environment within the building. For example, the BMS 910 can control lighting, temperature, carbon dioxide levels, and humidity within the building 904. There can be numerous mechanical or electrical devices that are controlled by the BMS 910 including, for example, furnaces or other heaters, air conditioners, blowers, and vents. To control the building environment, the BMS 910 can turn on and off these various devices according to rules or in response to conditions. Such rules and conditions can be selected or specified by a building manager or administrator, for example. One primary function of the BMS 910 is to maintain a comfortable environment for the occupants of the building 904 while minimizing heating and cooling energy losses and costs. In some implementations, the BMS 910 can be configured not only to monitor and control, but also to optimize the synergy between various systems, for example, to conserve energy and lower building operation costs.

Some implementations are alternatively or additionally designed to function responsively or reactively based on feedback sensed through, for example, thermal, optical, or other sensors or through input from, for example, an HVAC or interior lighting system, or an input from a user control. Further information may be found in U.S. Pat. No. 8,705, 162, titled "CONTROLLING TRANSITIONS IN OPTICALLY SWITCHABLE DEVICES," filed Apr. 17, 2012, (Attorney Docket No. VIEWP035), and issued Apr. 22, 2014, which is incorporated herein by reference in its entirety. Some implementations also can be utilized in existing structures, including both commercial and residential structures, having traditional or conventional HVAC or interior lighting systems. Some implementations also can be retrofitted for use in older residential homes.

The system 900 includes a network controller 912 configured to control a plurality of window controllers 914. For example, the network controller 912 can control tens, hundreds, or even thousands of window controllers 914. Each window controller 914, in turn, can control and drive one or more electrochromic windows 902. In some implementations, the network controller 912 issues high-level instructions such as the final tint state of an electrochromic window and the window controllers receive these commands and directly control their windows by applying electrical stimuli to appropriately drive tint state transitions and/or maintain tint states. The number and size of the electrochromic windows 902 that each window controller 914 can drive is generally limited by the voltage and current characteristics of the load on the window controller 914 controlling the respective electrochromic windows 902. In some implementations, the maximum window size that each window controller 914 can drive is limited by the voltage, current, or power requirements to cause the desired optical transitions in the electrochromic window 902 within a desired timeframe. Such requirements are, in turn, a function of the surface area of the window. In some implementations, this relationship is nonlinear. For example, the voltage, current, or power requirements can increase nonlinearly with the surface area of the electrochromic window 902. For example, in some cases, the relationship is nonlinear at least in part because the sheet resistances of the first and second conductive layers of an electrochromic stack in an IGU increase nonlinearly with distance across the length and width of the first or second conductive layers. In some implementations, the relationship between the voltage, current, or power requirements required to drive multiple electrochromic windows 902 of equal size and shape is, however, directly proportional to the number of the electrochromic windows 902 being driven.

Figure 9B:
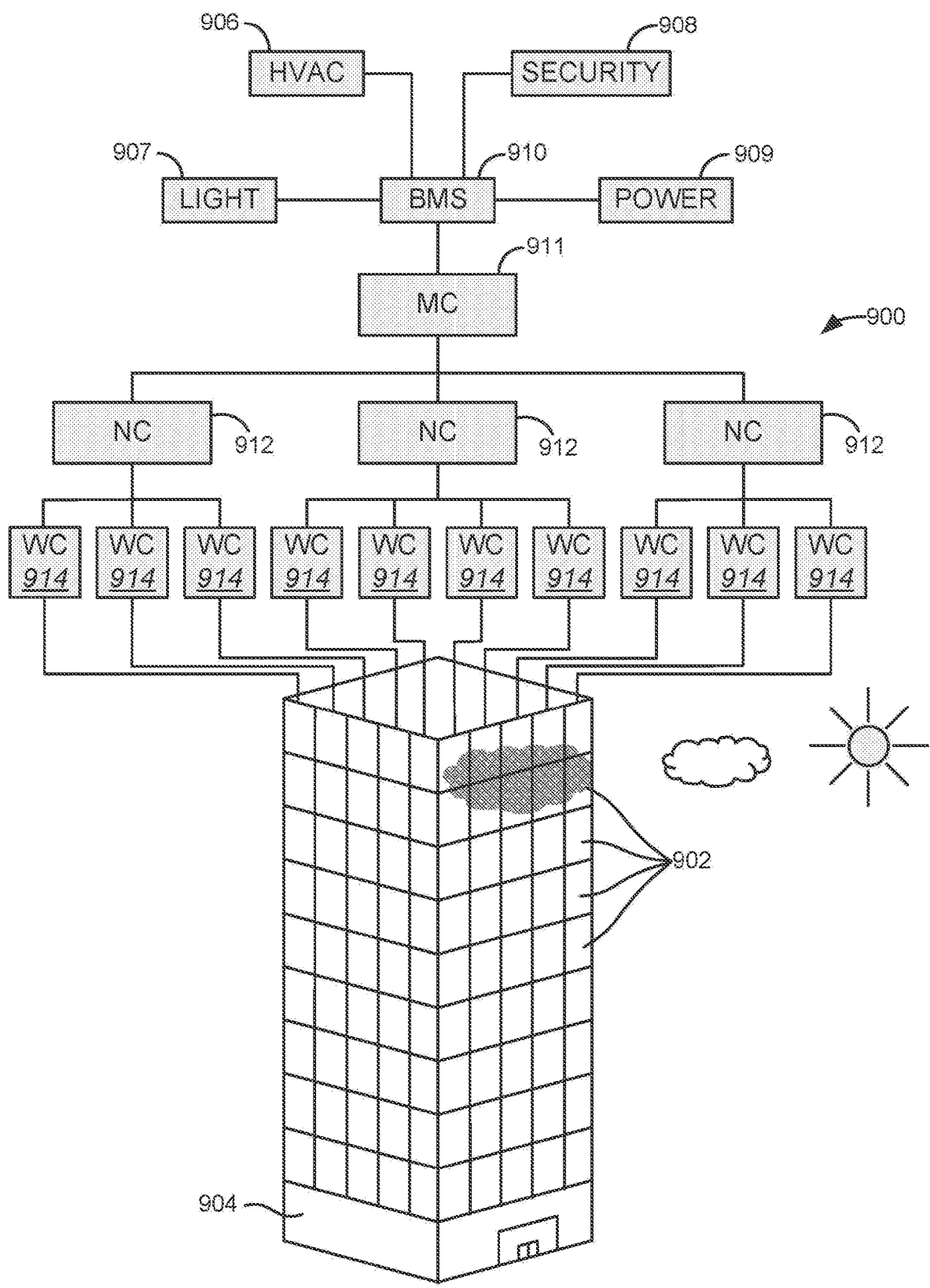
FIG. 9B shows a depiction of another example system for controlling and driving a plurality of electrochromic windows.

FIG. 9B depicts another example system 900 for controlling and driving a plurality of electrochromic windows 902. The system 900 shown in FIG. 9B is similar to the system 900 shown in FIG. 9A. In contrast to the system of FIG. 9A, the system 900 shown in FIG. 9B includes a master controller 911. The master controller 911 communicates and functions in conjunction with multiple network controllers 912, each of which network controllers 912 is capable of addressing a plurality of window controllers 914 as described with reference to FIG. 9A. In some implementations, the master controller 911 issues the high level instructions (such as the final tint states of the electrochromic windows) to the network controllers 912, and the network controllers 912 then communicate the instructions to the corresponding window controllers 914.

In some implementations, the various electrochromic windows 902 and/or antennas of the building or other structure are advantageously grouped into zones or groups of zones, each of which includes a subset of the electrochromic windows 902. For example, each zone may correspond to a set of electrochromic windows 902 in a specific location or area of the building that should be tinted (or otherwise transitioned) to the same or similar optical states based on their location. As a more specific example, consider a building having four faces or sides: a North face, a South face, an East Face and a West Face. Consider also that the building has ten floors. In such a didactic example, each zone can correspond to the set of electrochromic windows 902 on a particular floor and on a particular one of the four faces. In some such implementations, each network controller 912 can address one or more zones or groups of zones. For example, the master controller 911 can issue a final tint state command for a particular zone or group of zones to a respective one or more of the network controllers 912. For example, the final tint state command can include an abstract identification of each of the target zones. The designated network controllers 912 receiving the final tint state command can then map the abstract identification of the zone(s) to the specific network addresses of the respective window controllers 914 that control the voltage or current profiles to be applied to the electrochromic windows 902 in the zone(s).

In embodiments where at least some of the electrochromic windows have antennas, zones of windows for tinting purposes may or may not correspond to zones for antenna-related functions. For example, a master and/or network controller may identify two distinct zones of windows for tinting purposes, e.g., two floors of windows on a single side of a building, where each floor has different tinting algorithms based on customer preferences. In some implementations, zoning is implemented in a hierarchy of three or more tiers; e.g., at least some windows of a building are grouped into zones, and at least some zones are divided into subzones, with each subzone subject to different control logic and/or user access.

In many instances, optically-switchable windows can form or occupy substantial portions of a building envelope. For example, the optically-switchable windows can form substantial portions of the walls, facades and even roofs of a corporate office building, other commercial building or a residential building. In various implementations, a distributed network of controllers can be used to control the optically-switchable windows. FIG. 9C shows a block diagram of an example network system, 920, operable to control a plurality of IGUs 922 in accordance with some implementations. One primary function of the network system 920 is controlling the optical states of the electrochromic devices (or other optically-switchable devices) within the IGUs 922. In some implementations, one or more of the windows 922 can be multi-zoned windows, for example, where each window includes two or more independently controllable electrochromic devices or zones. In various implementations, the network system 920 is operable to control the electrical characteristics of the power signals provided to the IGUs 922. For example, the network system 920 can generate and communicate tinting instructions or commands to control voltages applied to the electrochromic devices within the IGUs 922.

In some implementations, another function of the network system 920 is to acquire status information from the IGUs 922 (hereinafter "information" is used interchangeably with "data"). For example, the status information for a given IGU can include an identification of, or information about, a current tint state of the electrochromic device(s) within the IGU. The network system 920 also can be operable to acquire data from various sensors, such as temperature sensors, photosensors (also referred to herein as light sensors), humidity sensors, airflow sensors, or occupancy sensors, antennas, whether integrated on or within the IGUs 922 or located at various other positions in, on or around the building.

The network system 920 can include any suitable number of distributed controllers having various capabilities or functions. In some implementations, the functions and arrangements of the various controllers are defined hierarchically. For example, the network system 920 includes a plurality of distributed window controllers (WCs) 924, a plurality of network controllers (NCs) 926, and a master controller (MC) 928. In some implementations, MC 928 can interact and communicate with BMS 910 from FIG. 9B, represented as outward-facing network 934. In some implementations, the MC 928 can communicate with and control tens or hundreds of NCs 926. In various implementations, the MC 928 issues high-level instructions to the NCs 926 over one or more wired or wireless links 946 (hereinafter collectively referred to as "link 946"). The instructions can include, for example, tint commands for causing transitions in the optical states of the IGUs 922 controlled by the respective NCs 926. Each NC 926 can, in turn, communicate with and control a number of WCs 924 over one or more wired or wireless links 944 (hereinafter collectively referred to as "link 944"). For example, each NC 926 can control tens or hundreds of the WCs 924. Each WC 924 can, in turn, communicate with, drive or otherwise control one or more respective IGUs 922 over one or more wired or wireless links 942 (hereinafter collectively referred to as "link 942").

The MC 928 can issue communications including tint commands, status request commands, data (for example, sensor data) request commands or other instructions. In some implementations, the MC 928 can issue such communications periodically, at certain predefined times of day (which may change based on the day of week or year), or based on the detection of particular events, conditions or combinations of events or conditions (for example, as determined by acquired sensor data or based on the receipt of a request initiated by a user or by an application or a combination of such sensor data and such a request). In some implementations, when the MC 928 determines to cause a tint state change in a set of one or more IGUs 922, the MC 928 generates or selects a tint value corresponding to the desired tint state. In some implementations, the set of IGUs 922 is associated with a first protocol identifier ("ID"), e.g., a BACnet ID. The MC 928 then generates and transmits a communication—referred to herein as a "primary tint command"—including the tint value and the first protocol ID over the link 946 via a first communication protocol (for example, a BACnet compatible protocol). In some implementations, the MC 928 addresses the primary tint command to the particular NC 926 that controls the particular one or more WCs 924 that, in turn, control the set of IGUs 922 to be transitioned. The NC 926 receives the primary tint command including the tint value and the first protocol ID and maps the first protocol ID to one or more second protocol IDs. In some implementations, each of the second protocol IDs identifies a corresponding one of the WCs 924.

The NC 926 subsequently transmits a secondary tint command including the tint value to each of the identified WCs 924 over the link 944 via a second communication protocol. In some implementations, each of the WCs 924 that receives the secondary tint command then selects a voltage or current profile from an internal memory based on the tint value to drive its respectively connected IGUs 922 to a tint state consistent with the tint value. Each of the WCs 924 then generates and provides voltage or current signals over the link 942 to its respectively connected IGUs 922 to apply the voltage or current profile.

Figure 9D:
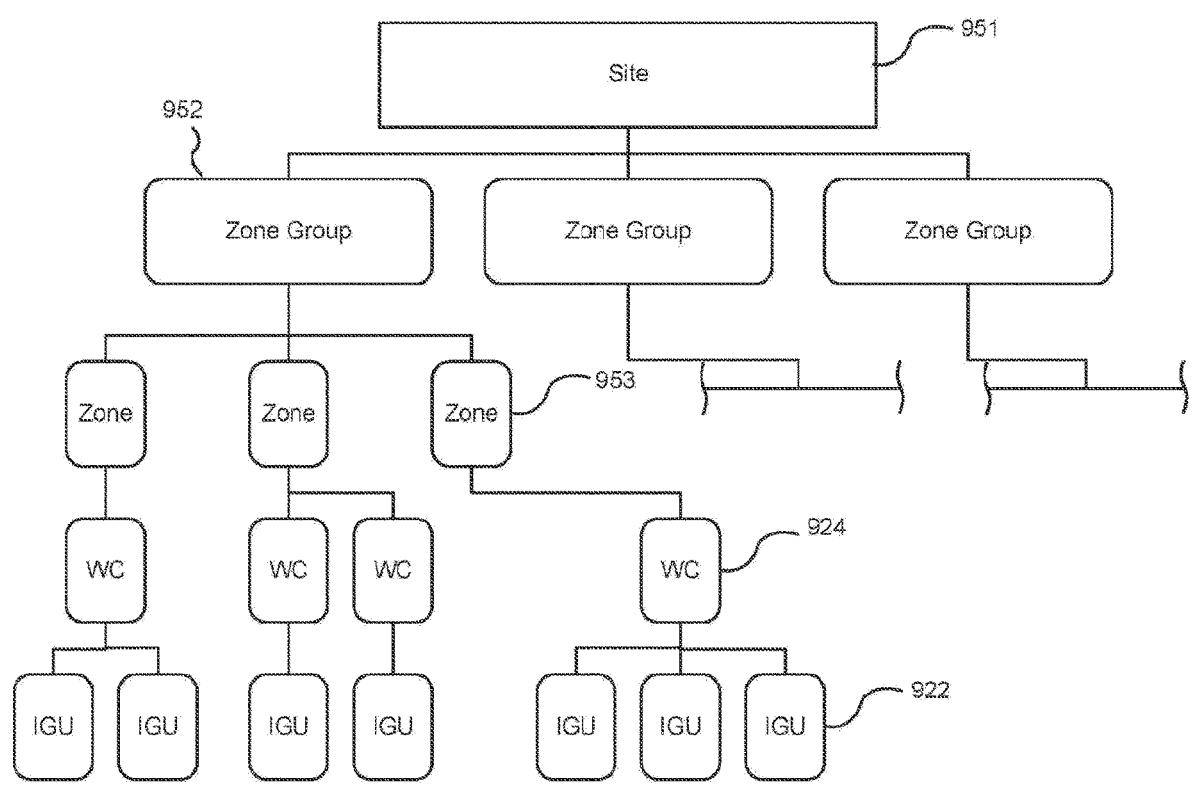
FIG. 9D depicts a hierarchical structure in which insulated glass units may be arranged.

Similarly to how the function and/or arrangement of controllers may be arranged hierarchically, electrochromic windows may be arranged in a hierarchical structure as shown in FIG. 9D. A hierarchical structure helps facilitate the control of electrochromic windows at a particular site by allowing rules or user control to be applied to various groupings of electrochromic windows or IGUs. Further, for aesthetics, multiple contiguous windows in a room or other site location must sometimes need to have their optical states correspond and/or tint at the same rate. Treating a group of contiguous windows as a zone can facilitate these goals.

As suggested above, the various IGUs 922 may be grouped into zones 953 of electrochromic windows, each of which zones 953 includes at least one window controller 924 and its respective IGUs 922. In some implementations, each zone of IGUs 922 is controlled by one or more respective NCs 926 and one or more respective WCs 924 controlled by these NCs 926. In some more specific implementations, each zone 953 can be controlled by a single NC 926 and two or more WCs 924 controlled by the single NC 926. Said another way, a zone 953 can represent a logical grouping of the IGUs 922. For example, each zone 953 may correspond to a set of IGUs 922 in a specific location or area of the building that are driven together based on their location. As a more specific example, consider a site 951 that is a building having four faces or sides: a North face, a South face, an East Face and a West Face. Consider also that the building has ten floors. In such a didactic example, each zone can correspond to the set of electrochromic windows 900 on a particular floor and on a particular one of the four faces. Additionally or alternatively, each zone 953 may correspond to a set of IGUs 922 that share one or more physical characteristics (for example, device parameters such as size or age). In some other implementations, a zone 953 of IGUs 922 can be grouped based on one or more non-physical characteristics such as, for example, a security designation or a business hierarchy (for example, IGUs 922 bounding managers' offices can be grouped in one or more zones while IGUs 922 bounding non-managers' offices can be grouped in one or more different zones).

In some such implementations, each NC 926 can address all of the IGUs 922 in each of one or more respective zones 953. For example, the MC 928 can issue a primary tint command to the NC 926 that controls a target zone 953. The primary tint command can include an abstract identification of the target zone (hereinafter also referred to as a "zone ID"). In some such implementations, the zone ID can be a first protocol ID such as that just described in the example above. In such cases, the NC 926 receives the primary tint command including the tint value and the zone ID and maps the zone ID to the second protocol IDs associated with the WCs 924 within the zone. In some other implementations, the zone ID can be a higher level abstraction than the first protocol IDs. In such cases, the NC 926 can first map the zone ID to one or more first protocol IDs, and subsequently map the first protocol IDs to the second protocol IDs.

When instructions relating to the control of any device (e.g., instructions for a window controller or an IGU) are passed through a network system 920, they are accompanied with a unique network ID of the device they are sent to. Networks IDs are necessary to ensure that instructions reach and are carried out on the intended device. For example, a window controller that controls the tint states of more than one IGU determines which IGU to control based upon a network ID such as a CAN ID (a form of network ID) that is passed along with the tinting command. In a window network such as those described herein, the term network ID includes but is not limited to CAN IDs, and BACnet IDs. Such network IDs may be applied to window network nodes such as window controllers 924, network controllers 926 and, master controllers 238. Oftentimes when described herein, a network ID for a device includes the network ID of every device that controls it in the hierarchical structure. For example, the network ID of an IGU may include a window controller ID, a network controller ID, and a master controller ID in addition to its CAN ID.

Commissioning Networks of Electrochromic Windows

In order for tint controls to work (e.g., to allow the window control system to change the tint state of one or a set of specific windows or IGUs), a master controller, network controller, and/or other controller responsible for tint decisions must know the network address of the window controller(s) connected to that specific window or set of windows. To this end, a function of commissioning is to provide correct assignment of window controller addresses and/or other identifying information to specific windows and window controllers, as well the physical locations of the windows and/or window controllers in buildings. In some cases, a goal of commissioning is to correct mistakes or other problems made in installing windows in the wrong locations or connecting cables to the wrong window controllers. In some cases, a goal of commissioning is to provide semi- or fully-automated installation. In other words, allowing installation with little or no location guidance for installers.

In general, the commissioning process for a particular window or IGU may involve associating an ID for the window or other window-related component with its corresponding window controller. The process may also assign a building location and/or absolute location (e.g., latitude, longitude, and elevation) to the window or other component. Further information related to commissioning and/or configuring a network of electrochromic windows is presented in International Patent Application No. PCT/US17/62634, titled "AUTOMATED COMMISSIONING OF CONTROLLERS IN A WINDOW NETWORK," filed Nov. 20, 2017 (Attorney Docket No. VIEWP092WO), which is hereby incorporated by reference in its entirety.

In some implementations, a commissioning association or linkage is made by comparing an architecturally determined location of a first component with a wirelessly measured location of a second component, which second component is associated with the first component. For example, the first component may be an optically switchable window and the second component may be a window controller configured to control the optical state of the optically switchable component. In another example, the first component is a sensor that provides measured radiation data to a window controller, which is the second component. Often the location of the first component is known with greater accuracy than the location of the second component, which location may be determined by a wireless measurement. While the accurate location of the first component may be determined from architectural drawings or a similar source, the commissioning process may employ alternative sources such as manually-measured post-installation locations of windows or other components. GPS may also be used. In various embodiments, the component whose location is determined by wireless measurement (e.g., a window controller) has a window network ID, and that network ID is made available during the commissioning process, e.g., via a configuration file. In such cases, the commissioning process may pair the accurate physical location of the first component with the network ID of the second component. In some embodiments, the first and second components are a single component. For example, a window controller may be such component; e.g., its position may be both determined from an architectural drawing and from wireless measurement. In such case, the commissioning process may simply ascribe the physical location from the architectural drawing with the network ID from the configuration file.

The associations determined during commissioning are stored in a file, data structure, database, or the like that can be consulted by various window network components and/or associated systems such as mobile applications, window control intelligence algorithms, Building Management Systems (BMSs), security systems, lighting systems, and the like. In certain embodiments, the commissioning linkages are stored in a network configuration file. In some cases, a network configuration file is used by the window network to send appropriate commands between components on the network; e.g., a master controller sends a tint command to the window controller for a window designated, by its location in a structure, for a tint change.

Figure 10A:
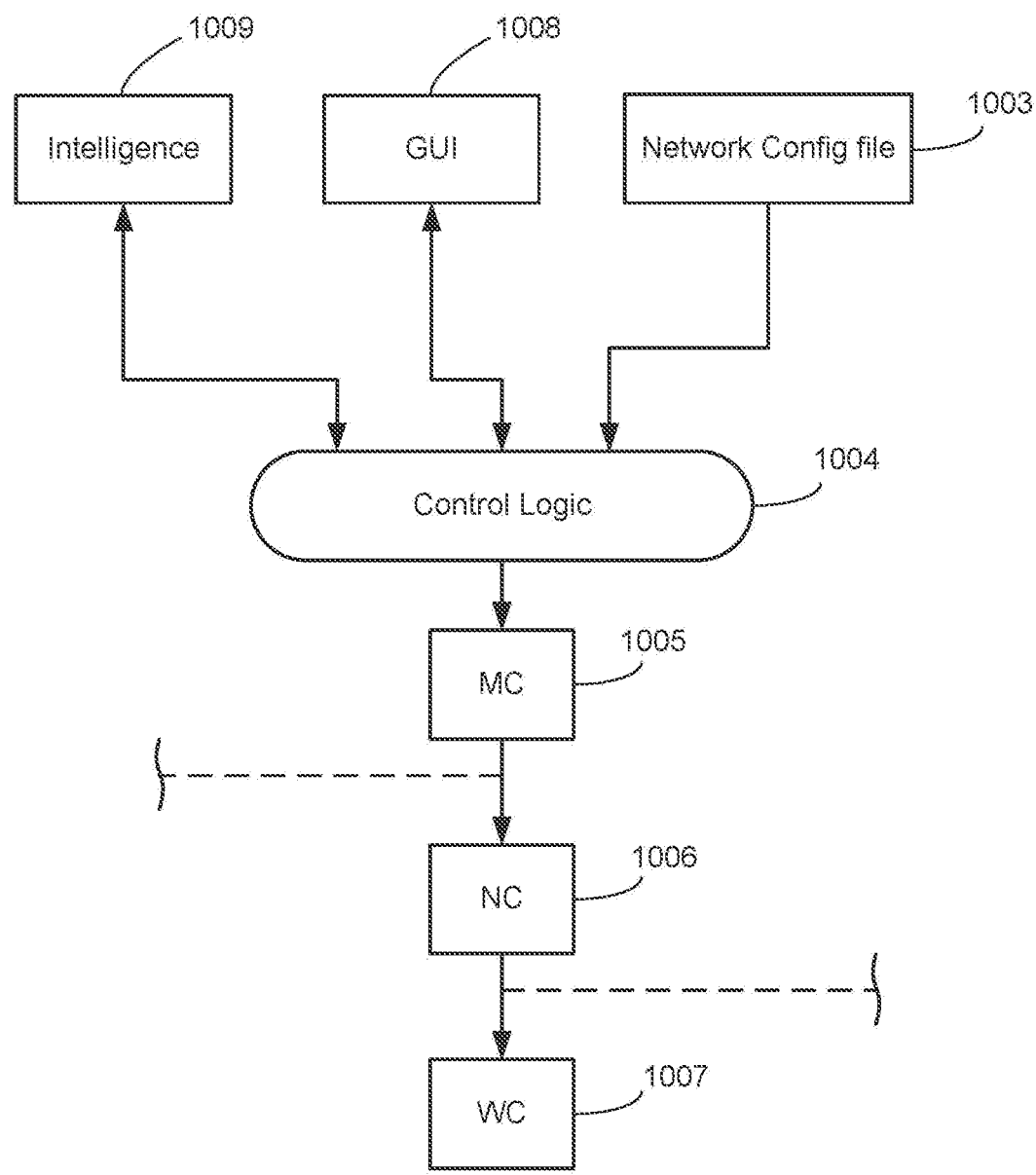
FIG. 10A depicts how a network configuration file is used by control logic to perform various functions on a window network.

FIG. 10A depicts an embodiment in which a network configuration file 1003 may be used by control logic 1004 to facilitate various functions on a network. While the following description uses the term "network configuration file," it should be understood that any suitable file, data structure, database, etc. may be used for the same purpose. Such file or other feature provides linkages between physical components of a window network (e.g., lite positions identified by a Lite ID) and network IDs (which may be or include network addresses) of controllers associated with such physical components (e.g., window controllers that directly control states of lites). Control logic 1004 refers to any logic that may use for making decisions or other purposes the linkages between physical components and associated controllers. As suggested, such logic may include logic provided with window network master controllers 1005, network controllers 1006, and window controllers 1007, as well as associated or interfacing systems such as mobile applications for controlling window states, window control intelligence algorithms, Building Management Systems, security systems, lighting systems, and the like. In some cases, a network configuration file 1003 is used by control logic 1004 to provide network information to a user interface for controlling the network 1008, such as an application on a remote wireless device, or to an intelligence system 1009 or a BMS. In some cases, a user interface 1008 of a mobile application is configured to use information provided by a network configuration file 1003 to control a master controller 1005, a network controller 1006, a window controller 1007, or other network components.

Figure 10B:
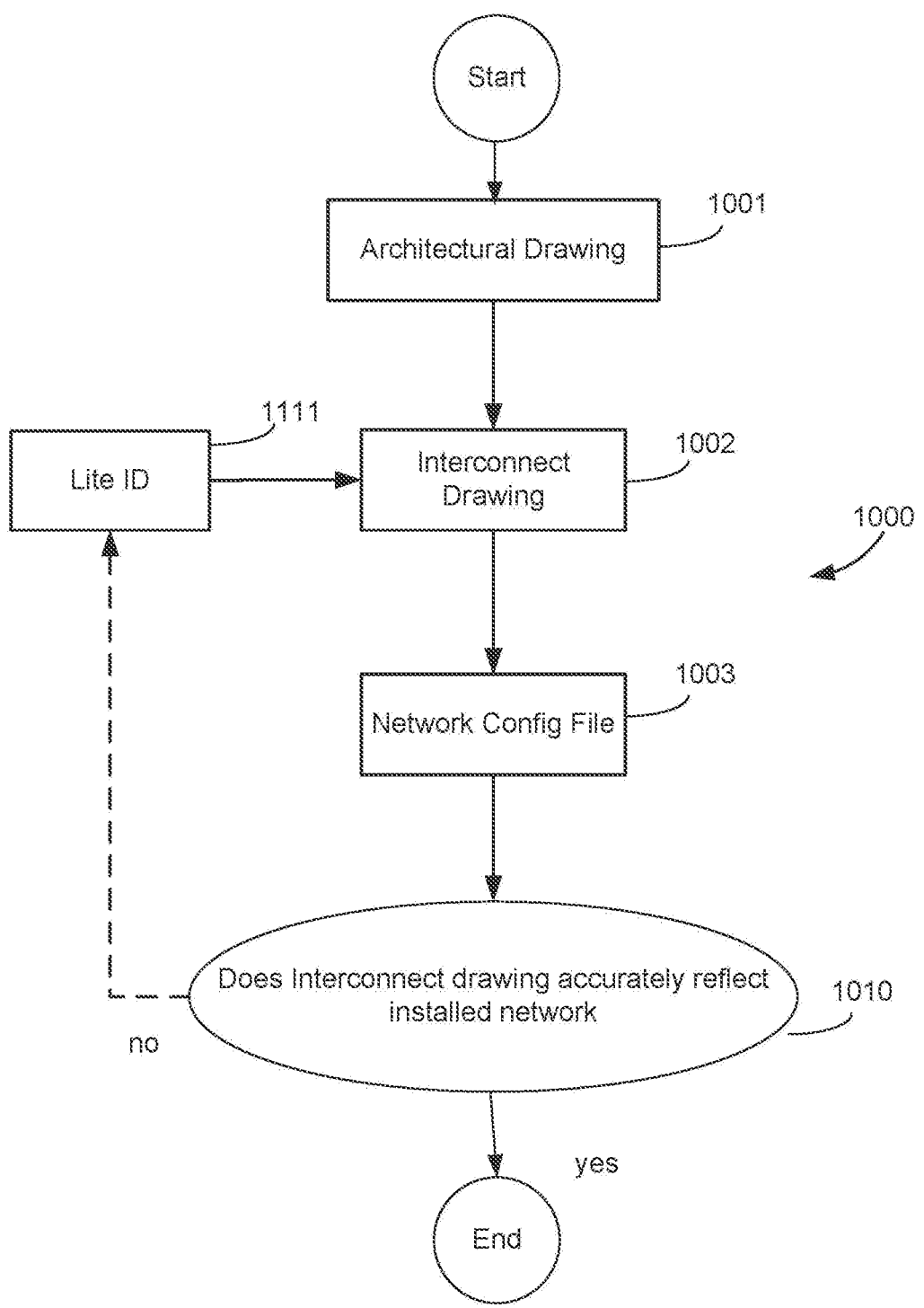
FIG. 10B depicts a process for creating a network configuration file according to some implementations.

An example of a process of creating a network configuration file 1000 is shown in FIG. 10B. The first operation is to determine the physical layout of a site from building plans such as architectural drawings 1001 so that the layout of a window network can be determined. Typically, architectural drawings 1001 provide building dimensions, locations of electrical closets, and various other structural and architectural features. In some cases, such as when architectural drawings are not available, architectural drawings may be created by first surveying a site. Using architectural drawings, an individual or team designs the wiring infrastructure and power delivery system for the electrochromic window network. This infrastructure, which includes power distribution components, is depicted visually in modified architectural drawings that are sometimes referred to as interconnect drawings 1002. Interconnect drawings depict wire routing (e.g., trunk lines) at a site, the positioning of various devices on the network (e.g., controllers, power supplies, control panels, windows, and sensors), and identifying information of network components (e.g., a network ID). In some cases, an interconnect drawing is not completed until the lite IDs (WIDs or other IDs) of installed optically switchable windows are matched to the devices installed locations. Inherently or explicitly, an interconnect drawing may also depict a hierarchical communications network including windows, window controllers, network controllers, and a master controller at a particular site. Typically, however, an interconnect drawing as initially rendered does not include network IDs for lites or other components on an optically switchable window network.

After an interconnect drawing is created, it is used to create a network configuration file 1003 which may be a textual representation of the interconnect drawing. Network configuration files 1003 may then be provided in a medium that is readable by control logic and/or other interfacing system, which allows the window network to be controlled in its intended fashion. So long as the interconnect drawing and the network configuration file accurately reflect the installed network 1010, the process of creating a preliminary network configuration file is complete. However, commissioning may add other information to the file to link installed optically switchable windows are matched to corresponding window controller network IDs. If at any point it is determined that the interconnect drawing and network configuration file do not match the installed network 1010, manual user intervention may be required to update the interconnect drawing 1002 with accurate lite ID (or other ID) information 1111. From the updated interconnect drawing the network configuration file 1003 is then updated to reflect changes that have been made.

Automatic Location Determination and Location Awareness

One aspect of commissioning allows for automated window location determination after installation. Window controllers, and in some instances windows configured with antennas and/or onboard controllers, may be configured with a transmitter to communicate via various forms of wireless electromagnetic transmission; e.g., time-varying electric, magnetic, or electromagnetic fields. Common wireless protocols used for electromagnetic communication include, but are not limited to, Bluetooth, BLE, Wi-Fi, RF, and UWB. The relative location between two or more devices may be determined from information relating to received transmissions at one or more antennas such as the received strength or power, time of arrival or phase, frequency, and angle of arrival of wirelessly transmitted signals. When determining a device's location from these metrics, a triangulation algorithm may be implemented that in some instances accounts for the physical layout of a building, e.g., walls and furniture. Ultimately, an accurate location of individual window network components can be obtained using such technologies. For example, the location of a window controller having a UWB micro-location chip can be easily determined to within 10 centimeters of its actual location. In some instances, the location of one or more windows may be determined using geo-positioning methods such as those described in "WINDOW ANTENNAS," U.S. patent application Ser. No. 62/340,936, filed on May 24, 2016 (Attorney Docket No. VIEWP072X1P), which is hereby incorporated by reference in its entirety. As used herein, geo-positioning and geolocation may refer to any method in which the position or relative position of a window or device is determined in part by analysis of electromagnetic signals.

Pulse-based ultra-wideband technology (ECMA-368 and ECMA-369) is a wireless technology for transmitting large amounts of data at low power (typically less than 0.5 mW) over short distances (up to 230 feet). A characteristic of a UWB signal is that it occupies at least 500 MHz of bandwidth spectrum or at least 20% of its center frequency. According to the UWB protocol, a component broadcasts digital signal pulses that are timed very precisely on a carrier signal across a number of frequency channels at the same time. Information may be transmitted by modulating the timing or positioning of pulses. Alternatively, information may be transmitted by encoding the polarity of the pulse, its amplitude and/or by using orthogonal pulses. Aside from being a low power information transfer protocol, UWB technology may provide several advantages for indoor location applications over other wireless protocols. The broad range of the UWB spectrum comprises low frequencies having long wavelengths, which allows UWB signals to penetrate a variety of materials, including walls. The wide range of frequencies, including these low penetrating frequencies, decreases the chance of multipath propagation errors as some wavelengths will typically have a line-of-sight trajectory. Another advantage of pulse-based UWB communication is that pulses are typically very short (less than 60 cm for a 500 MHz-wide pulse, less than 23 cm for a 1.3 GHz-bandwidth pulse) reducing the chances that reflecting pulses will overlap with the original pulse.

The relative locations of window controllers having micro-location chips can be determined using the UWB protocol. For example, using micro-location chips, the relative position of each device may be determined to within an accuracy of 10 cm. In various embodiments, window controllers, and in some cases antennas disposed on or proximate windows or window controllers are configured to communicate via a micro-location chip. In some embodiments, a window controller may be equipped with a tag having a micro-location chip configured to broadcast omnidirectional signals. Receiving micro-location chips, also known as anchors, may be located at a variety of locations such as a wireless router, a network controller, or a window controller having a known location. By analyzing the time taken for a broadcast signal to reach the anchors within the transmittable distance of the tag, the location of the tag may be determined. In some cases, an installer may place temporary anchors within a building for the purpose of commissioning which are then removed after the commissioning process is complete. In some embodiments in which there are a plurality of optically switchable windows, window controllers may be equipped with micro-location chips that are configured to both send and receive UWB signals. By analysis of the received UWB signals at each window controller, the relative distance between each other window controller located within the transmission range limits may be determined. By aggregating this information, the relative locations between all the window controllers may be determined. When the location of at least one window controller is known, or if an anchor is also used, the actual location of each window controller or other network device having a micro-location chip may be determined. Such antennas may be employed in an auto-commissioning procedure as described below. However, it should be understood that the disclosure is not limited to UWB technology; any technology for automatically reporting high-resolution location information may be used. Frequently, such technology will employ and one or more antennas associated with the components to be automatically located. Implementation where testers may be configured as tags or anchors is described further below.

As explained, interconnect drawings or other sources of architectural information often include location information for various window network components. For example, windows may have their physical location coordinates listed in x, y, and z dimensions, sometimes with very high accuracy; e.g., to within 1 centimeter. Similarly, files or documents derived from such drawings, such as network configuration files, may contain accurate physical locations of pertinent window network components. In certain embodiments, coordinates will correspond to one corner of a lite or IGU as installed in a structure. The choice of a particular corner or other feature for specifying in the interconnect drawing coordinates may be influenced by the placement of an antenna or other location-aware component. For example, a window and/or paired window controller may have a micro-location chip placed near a first corner of an associated IGU (e.g., the lower left corner); in which case the interconnect drawing coordinates for the lite may be specified for the first corner. Similarly, in the case where an IGU has a window antenna, listed coordinates on an interconnect drawing may represent the location of the antenna on the surface of an IGU lite or a corner proximate the antenna. In some cases, coordinates may be obtained from architectural drawings and knowledge of the antenna placement on larger window components such as an IGU. In some embodiments, a window's orientation is also included interconnect drawing.

While this specification often refers to interconnect drawings as a source of accurate physical location information for windows, the disclosure is not limited to interconnect drawings. Any similarly accurate representation of component locations in a building or other structure having optically switchable windows may be used. This includes files derived from interconnect drawings (e.g., network configuration files) as well as files or drawings produced independently of interconnect drawings, e.g., via manual or automated measurements made during construction of a building. In some cases where coordinates cannot be determined from architectural drawings, e.g., the vertical position of a window controller on a wall, unknown coordinates can be determined by personnel responsible for installation and/or commissioning. Because architectural and interconnect drawings are widely used in building design and construction, they are used here for convenience, but again the disclosure is not limited to interconnect drawings as a source of physical location information.

In certain embodiments using interconnect drawings or similarly detailed representation of component locations and geo-positioning, commissioning logic pairs component locations, as specified by interconnect drawings, with the network IDs (or other information not available in interconnect drawings) of components such as window controllers for optically switchable windows. In some embodiments, this is done by comparing the measured relative distances between device locations provided by geo-positioning and the listed coordinates provided on an interconnect drawing.

Since the location of network components may be determined with a high accuracy, e.g., better than about 10 cm, automatic commissioning may be performed easily in a manner that avoids the complications that may be introduced by manually commissioning windows.

The controller network IDs or other information paired with the physical location of a window (or other component) can come from various sources. In certain embodiments, a window controller's network ID is stored on a memory device attached to each window (e.g., a dock for the window controller or a pigtail), or may be downloaded from the cloud based upon a window serial number. One example of a controller's network ID is a CAN ID (an identifier used for communicating over a CAN bus). In addition to the controller's network ID, other stored window information may include the controller's ID (not its network ID), the window's lite ID (e.g., a serial number for the lite), window type, window dimensions, manufacturing date, bus bar length, zone membership, current firmware, and various other window details. Regardless of which information is stored, it may be accessed during the commissioning process. Once accessed, any or all portions of such information are linked to the physical location information obtained from the interconnect drawing, partially completed network configuration file, or other source.

In some implementations, applications engineering produces an interconnect drawing, then uses the location IDs of windows, physical location of windows, and the location IDs of window controllers from an architectural drawing to produce a network configuration file via, e.g., a computer-aided design software. This network configuration file will have zoning information incorporated into it, e.g., zones 953 and zone groups 952 in FIG. 9D. From there, a glazier may utilize a tester to obtain information and measurements from each IGU after installing them.

In some implementations, a tester may include an UWB module, like UWB module 840 in FIG. 8. These UWB modules may be DecaWave® radios (DWM1000) and may configure testers to act as tags or anchors that may be implemented for IGU location awareness and mapping used in commissioning with the network configuration file and interconnect drawing described above. Prior to installing the IGUs, a glazier or low voltage electrician may begin the commissioning process by placing up to eight testers configured as anchors around a floor of a building, e.g., at the four corners of a building floor and four other locations as far away from each other as possible, optionally within line of sight of each other, to set up the coordinate system, e.g., the x-axis and y-axis, for that particular floor of the building. Alternative arrangements are also possible, such as always placing an anchor by IGUs located on the same place on different floors. Then, the glazier may proceed to utilize a tester configured as a tag to test each IGU as discussed above, e.g., coupling the pigtail of an IGU to the tester and running the test. A tester and IGU can communicate with each other via wireless communication, e.g., Bluetooth Smart® or low energy, during a test, so a glazier may ensure that each IGU test provides the most accurate location testing data by placing the tester against the IGU at the same location on or near the surface of each IGU, e.g., the bottom left corner of the lite, during testing. This also provides some z-axis information as IGU dimensions read from IGU pigtails are factored into where on the IGU the tester was communicating with the IGU at. As the glazier tests each IGU, the tag-configured tester communicates wirelessly, e.g., via communications module 835 in FIG. 8 which may be a Bluetooth Smart® or low energy module, with a mobile device via a location engine mobile application. At every tested physical installation location of an IGU, the location engine mobile application captures and processes the position data of each IGU relative to the anchor-configured testers and relative to previously tested IGUs, while making use of information received from the IGU pigtail, e.g., IGU dimensions and lite ID, to establish IGU location mapping on the floor. This process may be repeated to allow for the IGUs of an installation site to be accurately mapped per floor. To get an accurate mapping of an entire building layout, a glazier or other installation technician may move, e.g., two or more anchor-configured testers to the next floor up from the floor previously mapped. This allows the anchor-configured testers on different floors to communicate with one another to establish the z-axis of the building coordinate system, which was previously limited to the x and y-axis, with slight z-axis coverage from IGU dimensions and measurements, for each floor. This process may also be used to create wire-frame models of buildings. The network configuration file produced by applications engineering may then be combined with the tester data to match lite IDs with IGU location information.

In some embodiments, such as when a tester does not have a UWB module, the physical location of an IGU may be determined via user input provided via an application that runs on a mobile device. For example, an application may be configured to display an interconnect drawing or a building map that displays the various window locations. In some embodiments, the application provides a list of window locations, e.g., a list specifying IGU coordinates or describing where the IGUs are located. When a glazier or other installation technician connects a tester to an IGU connector, the application may prompt the user to select the location of the IGU. The application can be configured to receive the user selection by, e.g., a touch-based selection or a voice-based selection. The application then pairs the selected location with the network ID or other ID of the corresponding IGU, as provided by the tester unit, and can used the paring for commissioning methods as described herein. In some cases, the application may also be configured to report the status of the IGU to a site monitoring system. The application may receive the network ID from the tester using a wireless connection to the mobile device (e.g., via Wi-Fi or Bluetooth) or, in some cases, using a wired connection to the device (e.g., a USB cable). In some embodiments, the tester may display a network ID to a user, and the application is configured to display a data field in which a user can manually provide the network ID as input. In some embodiments, the application is configured to use data from one or more sensors on the mobile device (e.g., accelerometers, gyroscopes, compasses, and GPS sensors) to track the movement of the device and provide a suggested location for an IGU based on the tracked movement. For example, if after selecting the location of a first window the application has detected that the mobile device has moved in a northward direction, the application may automatically suggest to a user that an adjacent window in the northward direction be selected.

When the mobile device establishes cellular connection, the data obtained from testing the IGUs is transferred to a data center, e.g., the cloud, and processed during commissioning to associate the IGU location data with control applications. A field service engineer or technician may, during commissioning, match the tester data with or overlay the tester data upon, e.g., interconnect drawing data generated by applications engineering and have lite IDs associated with IGU numbers, IGU locations, and a window controllers. Once the balance of the system powers up, the CAN ID of an IGU associates with its lite ID and thus the IGU location, e.g., x, y, and z-axis coordinates for each IGU, enabling the window control network to know which window or zone commands are being sent to.

Conclusion

Although the foregoing implementations have been described in some detail for purposes of clarity of understanding, it will be apparent that certain changes and modifications may be practiced within the scope of the appended claims. It should be noted that there are many alternative ways of implementing apparatuses of the present implementations. Accordingly, the present implementations are to be considered illustrative and not restrictive, and the implementations are not to be limited to the details given herein.

We claim:

1. An apparatus, comprising:
 a window assembly, the window assembly comprising an electrochromic device and an electrical connector including a connection interface; and,
 a cap configured to mate with the connection interface by way of a plurality contacts;
 wherein:
  the connection interface includes a plurality of pins and/or sockets configured to transfer information and/or power between the window assembly and an attached device; and
  one or more of the plurality of contacts are configured to allow charge to drain from the electrochromic device by shorting two or more of the pins and/or sockets together when the cap is mated with the connection interface.

2. The apparatus of claim 1, wherein the cap and the electrical connector have a keying interface configured to mechanically couple the cap with the electrical connector.

3. The apparatus of claim 1, wherein the connection interface is a 5-pin connection interface.

4. The apparatus of claim 1, wherein at least one of the plurality of contacts is a spring contact.

5. The apparatus of claim 1, further comprising an attachment component to protect the electrical connector.

6. The apparatus of claim 5, wherein the attachment component is a clip configured to be fastened to the window assembly.

7. The apparatus of claim 5, wherein the window assembly includes an insulated glass unit and the attachment component is configured to be placed within a secondary seal of the insulated glass unit.

8. The apparatus of claim 1, wherein
 the connection interface includes contacts in electrical communication with the electrochromic device;
 an input interface is configured to receive an input; and
 a controller is configured to receive the input from the input interface, and, through the connection interface, apply a voltage profile to the electrochromic device based at least on the received input, and/or receive data from the window assembly.

9. The apparatus of claim 8, wherein application of the voltage profile does not substantially tint the window assembly.

10. The apparatus of claim 8, further comprising a measurement module electrically coupled to the controller for measuring a current response of the electrochromic device in response to the applied voltage profile.

11. The apparatus of claim 10, wherein the controller is further configured to calculate a current density of the electrochromic device based at least on the applied voltage profile, a current response in response to the applied voltage profile, and dimensions of the electrochromic device.

12. The apparatus of claim 1, wherein:
the connection interface is configured to be coupled with a tester, the tester comprising a power source; a controller configured to apply a voltage profile to the electrochromic device; a measurement module electrically coupled to the controller for measuring a voltage response of the electrochromic device in response to an applied current profile; and one or more indicators; and
the tester is configured to determine a status of the window assembly by:
calculating a current density of the electrochromic device, wherein the current density is calculated based at least on dimensions of the electrochromic device and a voltage response to an applied current profile; and
indicating the status of the window assembly via the one or more indicators, wherein the status is based at least on the current density.

13. The apparatus of claim 1, further comprising:
a tester configured to determine a status of an electrochromic window, the tester comprising:
a port configured to be attached to the connection interface;
circuitry configured to apply a voltage profile to the electrochromic window and monitor a current response, wherein the status of the electrochromic window is based at least on the monitored current response,
an ultra-wideband module, and
a communications module;
a plurality of anchors each having an ultra-wideband module and a communications module; and
a computer program product configured to determine the position of the electrochromic window based at least on ultra-wideband signals transmitted between the tester and the plurality of anchors, the computer program product further comprising computer executable instructions to commission the electrochromic window or report the status of the electrochromic window to a site monitoring system.

14. The apparatus of claim 13, wherein the computer program product is configured to operate on one or more of: a master control, a network controller, a mobile device, a remote server, or the cloud.

15. The apparatus of claim 1, wherein:
at least two of the plurality of contacts are configured as electrical contacts for delivering charge to the electrochromic device; and
electrically coupling the at least two of the plurality of contacts results in draining charge from the electrochromic device.

16. The apparatus of claim 1, further comprising
a tester configured to determine a status of an electrochromic window, the tester comprising:
a port configured to be attached to the connection interface,
circuitry configured to apply a voltage profile to the electrochromic window and monitor a current response, wherein the status of the electrochromic window is based at least on the monitored current response, and
a communications module; and
a computer program product configured to receive a position of the electrochromic window via a user selection provided through a mobile device interface, the computer program product further comprising computer executable instructions to commission the electrochromic window and/or report the status of the electrochromic window to a site monitoring system.

17. A system comprising:
a window assembly including an electrochromic device;
an electrical connector including a connection interface configured to couple with a connector of the window, the connection interface comprising a first plurality of pins and/or sockets configured to transfer information and/or power between the window assembly and a controller coupled with the connection interface wherein
the controller configured to apply, through the connection interface, a voltage profile to the electrochromic device based at least on a received input, and/or configured to receive data from the window: and
a cap configured to mate with the connection interface by way of a plurality contacts; wherein
one or more of the plurality of contacts are configured to allow charge to drain from the electrochromic device by shorting two or more of the pins and/or sockets together when the cap is mated with the connection interface.

18. The system of claim 17, further comprising a measurement module electrically coupled to the controller for measuring a current response of the electrochromic device in response to the applied voltage profile.

19. A method comprising:
preparing an optically switchable window for installation, wherein the optically switchable window includes: (i) an electrochromic device, (ii) an electrical connector including a connection interface, the connection interface comprising a plurality of pins and/or sockets and (iii) a cap configured to mate with the connection interface by way of a plurality of contacts, the preparing including:
electrically shorting at least two of the plurality of pins and/or sockets such that charge is drained from the electrochromic device by attaching a cap configured to mate with the connection interface by way of a plurality contacts, one or more of the plurality of contacts being configured to short two or more of the pins and/or sockets together; and
electrically decoupling the at least two of the plurality of pins and/or sockets, after charge has been substantially drained from the electrochromic device.

20. The method of claim 19, further comprising:
connecting a tester to the window connector via a port on the tester after electrically decoupling the at least two of the plurality of pins and/or sockets, wherein the tester comprises:
a power source;
a controller configured to apply a voltage profile to the electrochromic device via the at least two pins and/or sockets;
a measurement module electrically coupled to the controller for measuring a voltage response of the electrochromic device in response to an applied current profile; and
one or more indicators;
calculating a current density of the electrochromic device, wherein the current density is calculated based at least on dimensions of the electrochromic device and a voltage response to an applied current profile; and indicating a status of the optically switchable window via the one or more indicators, wherein the status is based at least on the current density.

* * * * *